(12) United States Patent
Sakamoto et al.

(10) Patent No.: US 6,241,402 B1
(45) Date of Patent: Jun. 5, 2001

(54) DEVELOPING APPARATUS AND METHOD THEREOF

(75) Inventors: Kazuo Sakamoto, Kumamoto; Shuichi Nagamine, Nishi-Goshi-Machi, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/626,889

(22) Filed: Jul. 27, 2000

(30) Foreign Application Priority Data

Jul. 28, 1999 (JP) .................................................. 11-213747

(51) Int. Cl.[7] ...................................................... G03D 5/00
(52) U.S. Cl. .......................... 396/604; 396/611; 396/627; 118/52; 427/240
(58) Field of Search .................................. 396/604, 611, 396/627; 118/52, 319, 320, 500, 716; 427/240, 299; 134/902, 34, 3

(56) References Cited

U.S. PATENT DOCUMENTS

| | | | |
|---|---|---|---|
| 5,252,137 | 10/1993 | Tateyama et al. | ...................... 134/34 |
| 5,626,913 | 5/1997 | Tomoeda et al. | ..................... 427/299 |
| 5,689,749 | * 11/1997 | Tanaka et al. | ....................... 396/611 |
| 5,861,061 | * 1/1999 | Hayes et al. | ............................. 118/52 |

* cited by examiner

*Primary Examiner*—D. Rutledge
(74) *Attorney, Agent, or Firm*—Rader, Fishman & Grauer

(57) ABSTRACT

A wafer is held by a wafer holding section, and while a developing solution is supplied onto a top surface of the wafer, the wafer is rotated 180 degrees, whereby performing the heaping of the developing solution on the top surface of the wafer. Thereafter, the rotation of the wafer is stopped, then holding pins are raised to receive the wafer from the wafer holding section, whereby holding the wafer with the wafer being raised above the wafer holding section by the holding pins, and the wafer is left standing for a predetermined time to thereby perform development. In doing as above, the temperature influence exerted on the wafer from the wafer holding section with large heat capacity is prevented, and the temperature distribution of the developing solution within the wafer plane can be prevented from occurring, thus preventing the occurrence of unevenness in the development caused by the temperature difference from occurring and making it possible to perform development processing with uniformity. As a result, when development processing is performed for a substrate, for example, a wafer, uniformity of the processing can be increased.

16 Claims, 23 Drawing Sheets

DEVELOPING APPARATUS AND METHOD THEREOF

BACKGROUND OF THE INVENTION

1. Field of the Invention

The present invention relates to a developing apparatus and method thereof for performing developing processing for, for example, substrates.

2. Description of the Related Art

A mask for forming a predetermined pattern on a top surface of a glass substrate (LCD substrate) of a liquid crystal display or a semiconductor wafer (hereinafter referred to as "a wafer" ) is obtained by applying a resist onto a top surface of a substrate such as a wafer, thereafter applying light, electron beams, ionic beams or the like, to the resist surface, and performing development.

The developing processing here is performed by dissolving the portions to which light or the like has been radiated or the portions without such radiation with use of an alkaline solution or the like, and is conventionally performed, for example, as follows. Initially, as shown in FIG. 25A, a substrate, for example, a wafer W is vacuum-held on a spin chuck 10 having, for example, a vacuum-suction function, and a bar-shaped supply nozzle 11 having a number of discharging apertures is disposed above a center portion of the wafer W. Then as shown in FIG. 25B, the wafer is rotated 180 degrees while a developing solution D is supplied onto the top surface of the wafer from the supply nozzle 11, and thereby the developing solution D is heaped on the resist film. Subsequently, as shown in FIG. 25 C, after the wafer W is left standing for 60 seconds with the rotation of the wafer W being stopped, a rinse solution is supplied onto the top surface of the wafer to remove the developing solution, and thus the development is performed.

Though the developing solution D is controlled at a temperature of, for example, about 23° C., water contained in the developing solution D vaporizes while the wafer W and is left standing with the solution-heaping being performed, thereby depriving the latent heat of the developing solution D, and as a result, the temperature of the developing solution D decreases with time as shown in FIG. 26.

Meanwhile, the spin chuck 10 for holding an area close to a center of the wafer W has some dimensions, since it vertically moves, and rotates, while holding the wafer W. The spin chuck 10 is maintained at the temperature of, for example, about 23° C. by, for example, temperature-adjusting water so that the influence of the temperature from a motor not illustrated for driving the spin chuck 10 is eliminated. Accordingly, the spin chuck 10 has a large thermal capacity, which brings about the difference in the degree of the temperature reduction of the developing solution D between the portion of the wafer W in contact with the spin chuck 10 and the portion not in contact therewith, and thus the temperature of the area close to the center of the wafer does not easily decrease compared with that of a peripheral portion.

Consequently, the temperature difference in the developing solution D of about 1° C. occurs between the area close to the center and the peripheral portion of the wafer at the time of starting rinse. When such temperature distribution occurs on the wafer, the temperature difference in the developing solution D has an effect on the progress of the development, thus bringing about an uneven sate of development and causing a disadvantage of varying the finished dimensions. In concrete, with use of an I beam resist, if the temperature difference is 1°C., line width differs by about 4 nm, and thus if the line width in the area close to the center of the wafer is about 0.4 micrometers, the line width in the peripheral portion becomes about 0.396 micrometers.

SUMMARY OF THE INVENTION

An object of the present invention is to provide a developing apparatus and method thereof, which prevent the occurrence of inconsistent development caused by the temperature difference in a developing solution by making the temperature of the developing solution almost uniform within the plane of the substrate, and which increase uniformity of the developing processing.

In order to attain the above object, a developing apparatus of the present invention comprises a substrate holding section for holding a substrate, a substrate holding protrusion section provided to be vertically movable relatively to the substrate holding section so that it does not interfere with the aforementioned substrate holding section, for holding the substrate with the substrate being spaced from the aforementioned substrate holding section, and a supply section for supplying a developing solution onto a processed surface, wherein development is performed for the processed surface of the substrate in the state in which the substrate with the developing solution being heaped thereon is spaced from the aforementioned substrate holding section by the aforementioned substrate holding protrusion section, with the developing solution remaining heaped. In this situation, for example, the aforementioned substrate holding section holds an area close to a center on a surface opposite to the processed surface of the substrate, and the aforementioned substrate holding protrusion section holds a peripheral area outside the area held by the aforementioned substrate holding section on the surface opposite to the processed surface of the substrate.

In the above apparatus, in a developing method of supplying a developing solution onto a substrate to perform development, a developing method is carried out, which comprises the steps of allowing a substrate holding section to hold the substrate to allow a developing solution to be heaped on a processed surface of the substrate, subsequently, vertically moving a substrate holding protrusion section relatively to the substrate holding section so that the substrate holding protrusion section does not interfere with the substrate holding section, transferring the substrate to the substrate holding protrusion section from the aforementioned substrate holding section, and performing development of the processed surface of the substrate, with the substrate being spaced from the aforementioned substrate holding section by means of the substrate holding protrusion section, with the developing solution remaining heaped thereon.

In doing as above, the development of the processed surface of the substrate is performed in the state in which the substrate to which the developing solution has been supplied is spaced from the aforementioned substrate holding section by means of the aforementioned substrate holding protrusion section, with the developing solution remaining heaped thereon, and therefore the temperature influence is difficult to be transmitted to the substrate from the substrate holding section, thus making the temperature variation of the developing solution on the substrate almost uniform within the plane of the substrate, preventing the occurrence of unevenness in the processing caused by the temperature difference in the developing solution, and making it possible to increase uniformity of the developing processing.

It may be suitable that the aforementioned substrate holding protrusion section holds an area close to the outside of the area held by the aforementioned substrate holding section, which is a peripheral area outside the area held by the aforementioned substrate holding section, of the surface opposite to the processed surface of the substrate, and an area close to an outer edge of the substrate. In this case, the substrate is held by the substrate holding protrusion section to prevent a warp from occurring within the plane, and thus the height of the developing solution in the plane of the substrate is difficult to be nonuniform, which makes the degree of the progress of the development uniform within the plane.

As for the aforementioned substrate holding protrusion section, it is preferable that a contact area between the substrate holding protrusion section and the substrate is smaller than a contact area between the aforementioned substrate holding section and the substrate. Further, the aforementioned substrate holding protrusion section may include an annular member for preventing the processing solution from coming onto the surface opposite to the processed surface of the substrate.

These objects and still other objects and advantages of the present invention will become apparent upon reading the following specification when taken in conjunction with the accompanying drawings.

BRIEF DESCRIPTION OF THE DRAWINGS

FIG. 15A is an external view in which a nozzle is rotated, and FIG. 15B is an external view in which the nozzle is moved horizontally;

DETAILED DESCRIPTION OF THE PREFERRED EMBODIMENT

Figure 1A:
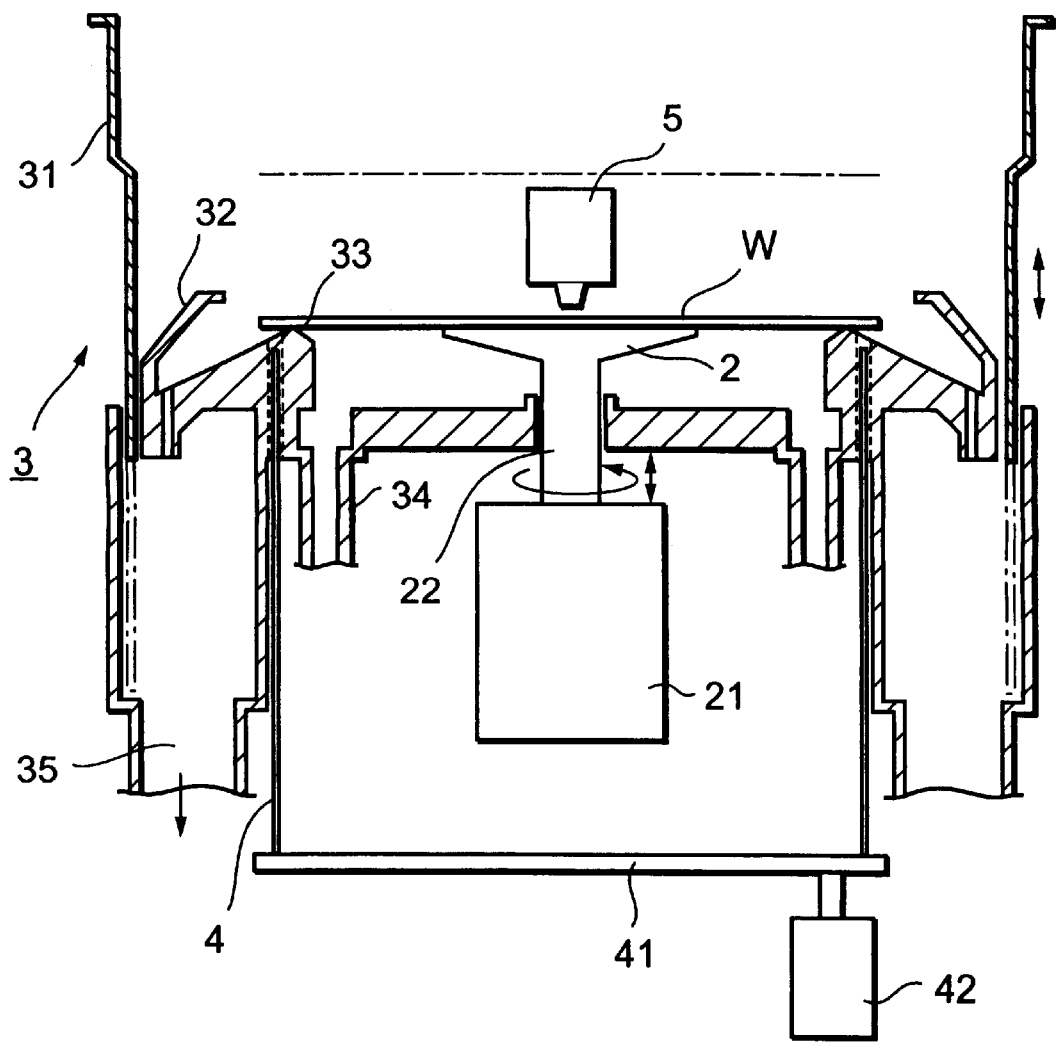
FIG. 1A is a sectional view showing an example of a developing apparatus according to an embodiment of the present invention.

FIG. 1A is a longitudinal sectional view of a developing apparatus to which the present invention is applied. Numeral 2 in FIG. 1A denotes a wafer holding section formed of resin such as, for example, polytetrafluoroethylene and polyether ether ketone, for substantially horizontally holding an area close to a center of a wafer W being a substrate with a surface to be processed up, and for rotating the wafer W around a vertical axis and also for vertically moving the same. The wafer holding section 2 forms a substrate holding section, having, for example, a vacuum-suction function, and is constructed to be freely rotatable around the vertical axis via a rotating shaft 22 and vertically movable by means of a driving section 21 in which a raising and lowering mechanism and a motor are combined. Thus, the wafer W is held by the wafer holding section 2 to be vertically movable, and rotatable in a space between a processing position in which it is sucked and held by the wafer holding section 2 shown in FIG. 1 and a delivery position for the wafer W which is above the processing position, shown by the alternate long and short dash line in FIG. 1A.

A cylindrical cup 3 is provided around the wafer holding section 2, for enclosing the wafer W located in the aforesaid processing position to prevent a developing solution from splashing into the surroundings when the developing solution supplied onto the wafer is shaken off. The cup 3 comprises an outer cup 31 and an inner cup 32. The outer cup 31 is constructed to be vertically movable by an elevating mechanism not illustrated so that an upper end thereof is located at a higher position than the aforementioned delivery position for the wafer W at the time of preventing the developing solution from splashing out and the upper end is located at an lower position than the aforementioned delivery position for the wafer W at the time of delivering the wafer W and applying a processing solution thereto.

The inner cup 32 is inside the outer cup 31, at a position lower than the aforementioned delivery position for the wafer W, and is provide so that an upper end of the inner cup 32 is located at a higher position than the wafer W when the wafer W is located in the aforementioned processing position. The inner cup 32 is inclined inward toward a top at a periphery side of the wafer W, and under the wafer W, an annular raised portion 33 is provided in such a manner as to be almost in contact with a peripheral portion of an undersurface side of the wafer W located in the aforesaid processing position in order to prevent a developing solution from coming onto the undersurface side of the wafer W, and the inner cup 32 is formed to be inclined upward to the raised portion 33 from the outside of the wafer W.

Figure 1B:
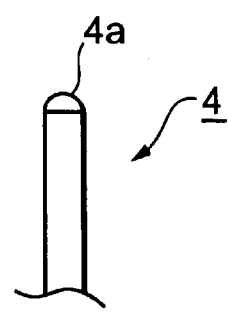
FIG. 1B is an enlarged side view showing a tip portion of a holding pin.

A plurality of, for example, three holding pins 4, for example, are included in the inner cup 32 at the positions corresponding to the peripheral area (the area outside the held area when the wafer W is held by the wafer holding section 2) of the undersurface side of the wafer W. These holding pins 4 form a substrate holding protrusion section for holding the wafer W at the peripheral area of the aforesaid undersurface side with the wafer W being raised above the wafer holding section 2. The above holding pins 4 are each made of, for example, stainless steel, and are each provided with protective member 4a made of, for example, alumina at a tip end thereof as shown in FIG. 1B. A contact area between the holding pins 4 and the wafer W when the holding pins 4 hold the wafer W is set to be considerably smaller than a contact area between the wafer holding section 2 and the wafer W when the wafer W is held by the wafer holding section 2. The reason why the protective member 4a made of alumina is provided at the tip end of the holding pin 4 is that unprotected stainless steel causes metal corrosion and that the resistance to alkalies is required since the developing solution is alkaline, and the protective member 4a may be formed of alkali-resistant resin other than alumina.

Lower ends of the holding pins 4 are connected to an elevating mechanism 42 via a horizontal supporting arm 41, and the upper ends of the holding pins 4 are vertically movable between a waiting position located below the wafer W in the aforesaid processing position and the position located above the waiting position, in which the wafer W is held and raised above the wafer holding section 2. The holding pins 4 and the wafer holding section 2 are thus vertically moved relatively to each other. Further, with the cup 3, connected are a drain passage 34 for a treating solution and a discharge passage 35 used as an exhaust passage and the drain passage, and the discharge passage 35 is connected with a gas-liquid separating means not illustrated.

Figure 2A:
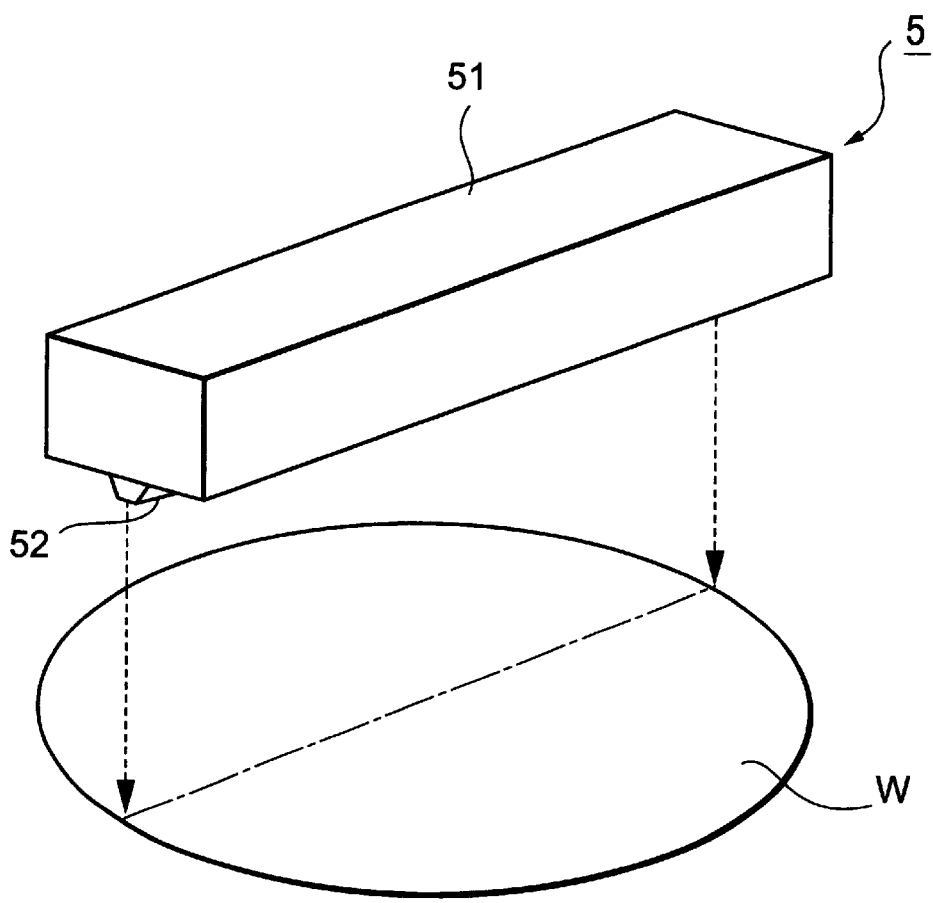
FIGS. 2A and 2B are a perspective view and a bottom view showing a nozzle used in the aforementioned developing apparatus.
Figure 2B:
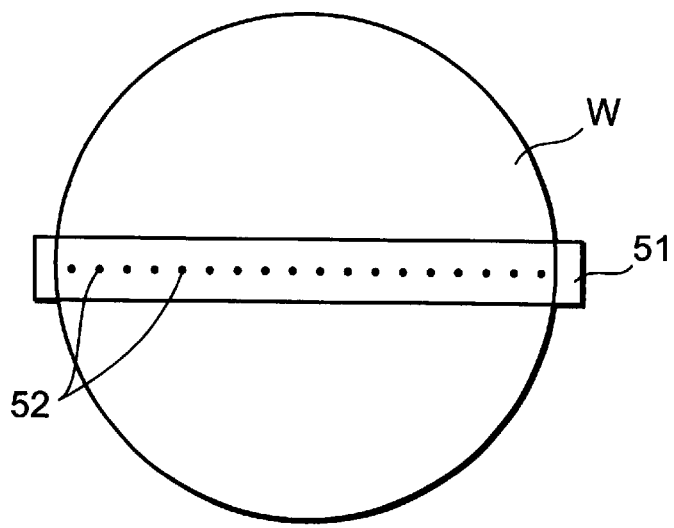

Above the wafer W located in the processing position and vacuum-sucked by the wafer holding section 2, provided is a nozzle 5 forming a supply section for supplying the developing solution being a treating solution onto a top surface of the wafer W. As shown in FIG. 2A and FIG. 2B, the nozzle 5 includes a nozzle body 51 formed to be, for example, a laterally slim oblong bar shape, and supplying apertures 52 provided in an undersurface of the nozzle body 51, for discharging the developing solution onto the top surface of the wafer along a radial direction thereof. The aforementioned nozzle body 51 and the supplying apertures 52 are configured to supply the developing solution to an area close to a center line (a line passing through the center of the wafer W and extending in the radial direction) of the top surface of the wafer.

Figure 3:
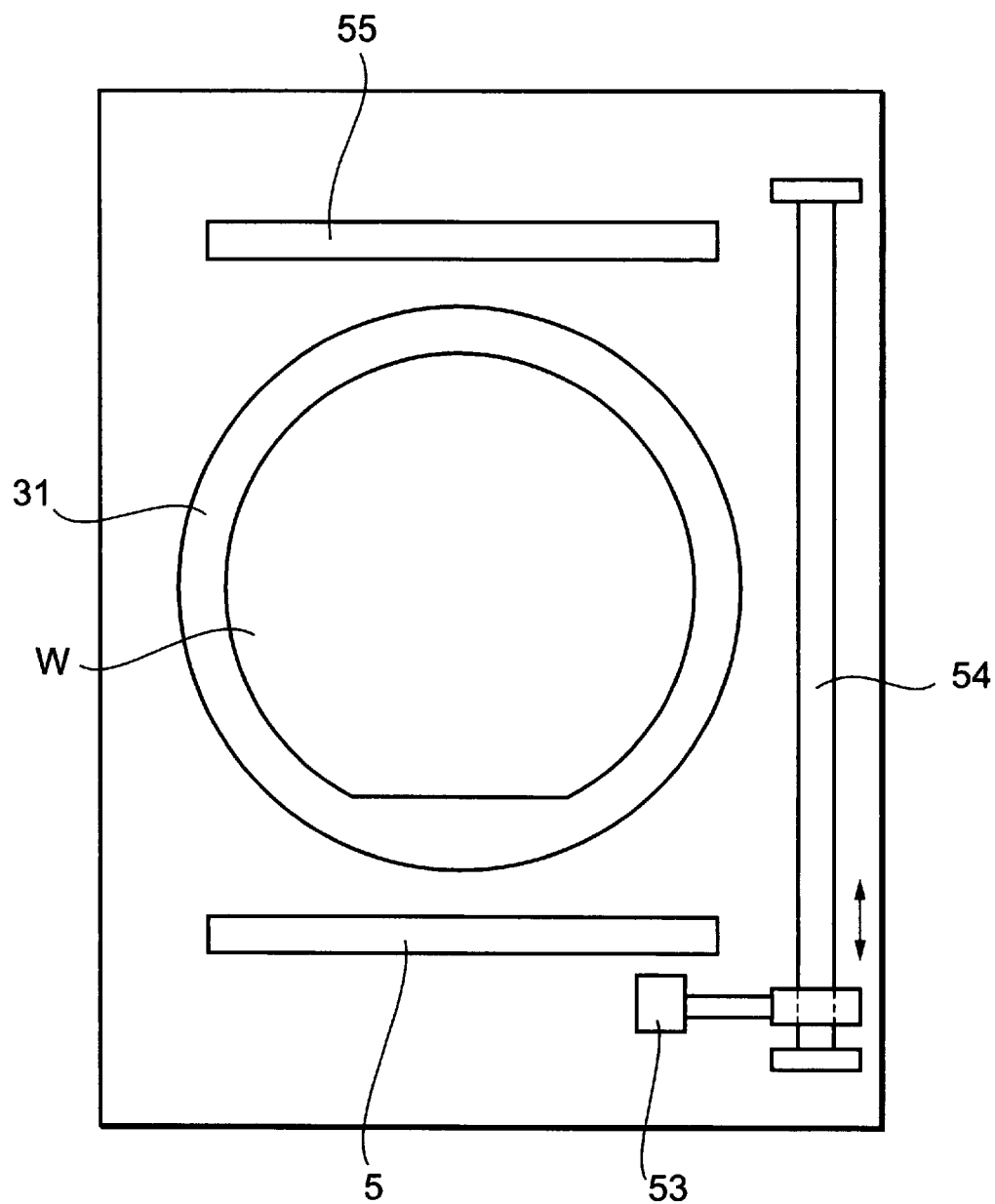
FIG. 3 is a plan view of the aforementioned developing apparatus.

The nozzle 5 is held by a nozzle holding section 53 as shown in, for example, FIG. 3, and is constructed to be horizontally movable along a guide rail 54 and vertically movable by means of an elevating mechanism not illustrated. As a result, the nozzle 5 can move between a waiting position outside the wafer holding section 2 and an upper position above almost the center portion of the wafer holding section 2 so that it does not interfere with the delivery of the wafer W, and the nozzle can also vertically move between the aforementioned upper position and a developing solution supplying position being lower than the upper position.

The above nozzle 5 is communicated with a developing solution storage tank (illustration in the drawings is omitted) via a supply line not illustrated. The developing apparatus also includes a rinse nozzle 55 for supplying a rinse solution for washing away the developing solution on the top surface of the wafer W. The rinse nozzle 55 is constructed almost in the same manner as, for example, the aforesaid nozzle 5 to be held by a nozzle holding section 53 and movable between a waiting position outside the wafer holding section 2 and a supply position in which the rinse solution is supplied onto the wafer.

Figure 4A:
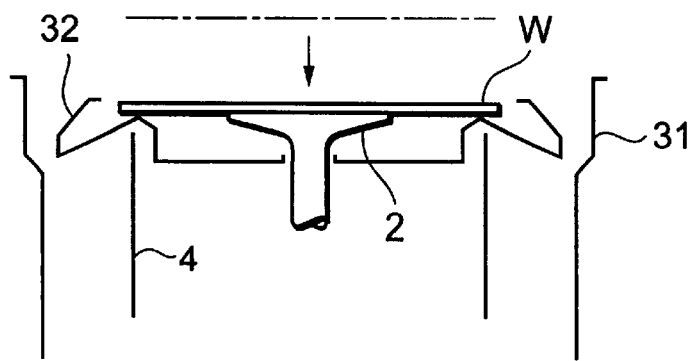
FIGS. 4A, 4B and 4C are process views showing an operation of the aforementioned developing apparatus.

Subsequently, an embodiment of the present invention with use of the aforementioned apparatus will be explained with the case in which it is applied to developing processing as an example, with reference to FIG. 4 to FIG. 6. Initially, as shown in FIG. 4A, the outer cup 31 is moved lower than the delivery position for the wafer W, and the wafer holding section 2 is raised to the aforementioned delivery position. Then, the wafer W having a resist film formed thereon and exposed is transferred onto the wafer holding section 2 by means of a transfer arm not illustrated, and vacuum-sucked by the wafer holding section 2. As the technique of pressing the wafer W onto the wafer holding section 2, for example, a mechanical chuck for mechanically pressing down, for example, the peripheral portion of the wafer W may be used.

Figure 4B:
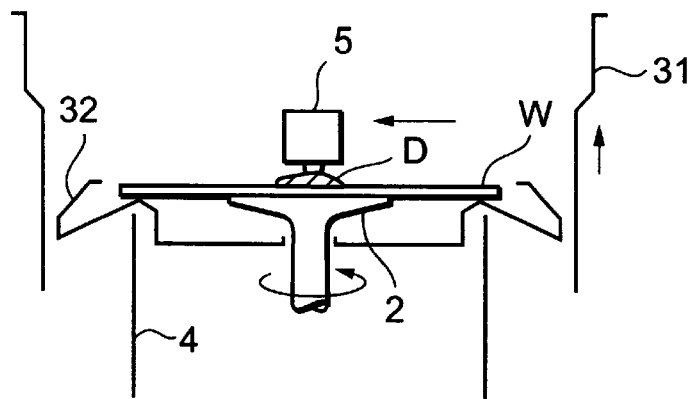

As shown in FIG. 4B, the nozzle 5 located in the waiting position is moved to the supply position through the upper position above the wafer holding section 2, then the upper end of the outer cup 31 is located at a higher position than the aforementioned delivery position for the wafer W, whereby discharging a developing solution D from the nozzle 5 to thereby supply the developing solution D onto the area close to the center line of the wafer W, and the wafer holding section 2 is rotated 180 degrees to perform the heaping of the developing solution. Specifically, at the processing position, tip ends of the supplying apertures 52 of the nozzle 5 are in contact with the developing solution D supplied onto the top surface of the wafer from the nozzle 5. In this situation, when the developing solution D is supplied onto the top surface of the wafer from the supplying apertures 52 while the wafer W is rotated 180 degrees, the developing solution D is spread by centrifugal force of the rotation and is rolled down by the supplying apertures 52 of the nozzle 5, thereby applying the coating of the developing solution D onto the entire top surface of the wafer W, thus performing solution-heaping.

Figure 4C:
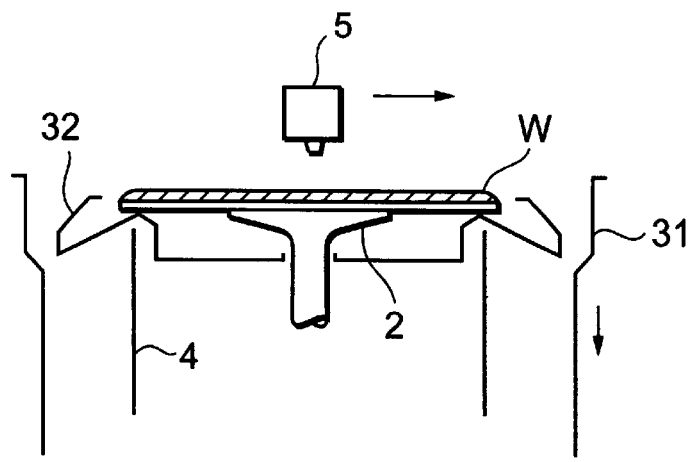

Subsequently, as shown in FIG. 4C, the rotation of the wafer W is stopped, then the vacuum-sucked by the wafer holding section 2 is released and the outer cup 31 is lowered so that its upper end is located at a lower position than the aforementioned delivery position for the wafer W, and nozzle 5 is moved to the waiting position.

Figure 5A:
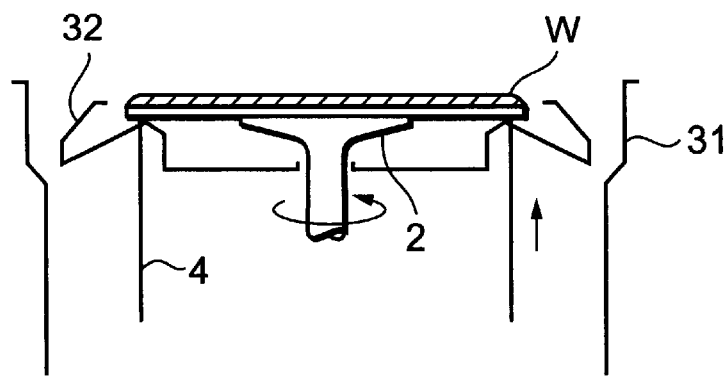
FIGS. 5A and 5B are process views showing the operation of the aforementioned developing apparatus.
Figure 5B:
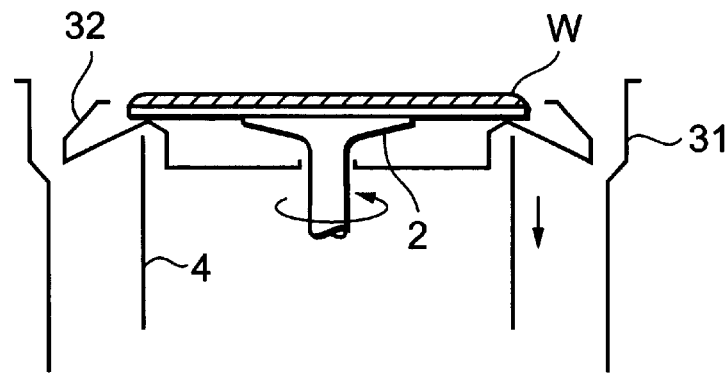

Thereafter, as shown in FIG. 5A, the holding pins 4 are raised, and the wafer W is transferred onto the holding pins 4 from the wafer holding section 2, whereby leaving the wafer W standing for 60 seconds, for example, while the wafer W is held by means of the holding pins 4 with the wafer W being raised above the wafer holding section 2, thus performing development. After the development is performed as above, the holding pins 4 are lowered, and the wafer W is transferred onto the wafer holding section 2 once again as shown in FIG. 5B to be vacuum-sucked by the wafer holding section 2.

Figure 6A:
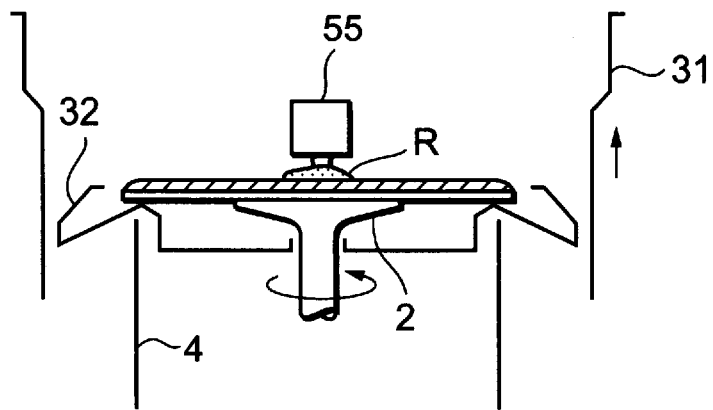
FIGS. 6A, 6B and 6C are process views showing the operation of the aforementioned developing apparatus.
Figure 6B:
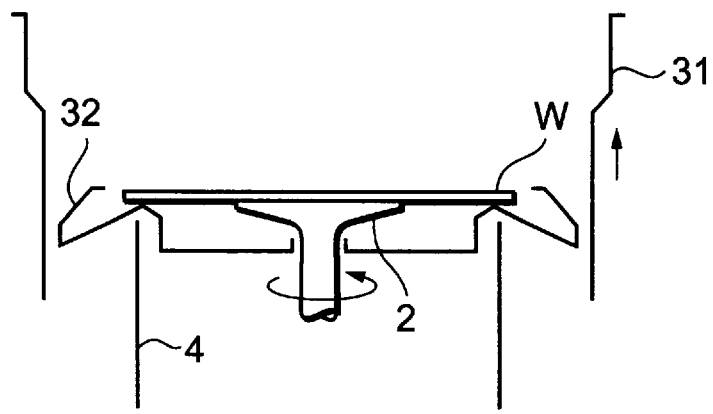
Figure 6C:
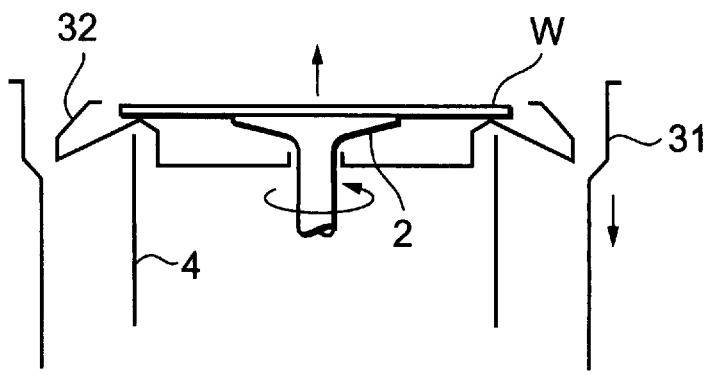

Subsequently, as shown in FIG. 6A, the rinse nozzle 55 located in the waiting position is moved to the supply position through the upper position above the wafer holding section 2, then the upper end of the outer cup 31 is located at a higher position than the aforementioned delivery position for the wafer W, and a rinse solution R is discharged from the rinse nozzle 55 to thereby perform washing. Then as shown in FIG. 6B, with the upper end of the outer cup 31 being located at a higher position than the aforementioned delivery position for the wafer W, the wafer W is rotated at a high speed to thereby dry the wafer top surface. Thereafter, as shown in FIG. 6C, the outer cup 31 is lowered, while the wafer holding section 2 is raised up to the delivery position of the wafer W, and the vacuum-suction of the wafer W by the wafer holding section 2 is released, whereby transferring the wafer W to a transfer arm not illustrated.

In the above developing method, by holding the wafer W with the holding pins 4, the development is performed with the wafer W spaced from the wafer holding section 2 and raised above the wafer holding section 2, thus making it difficult to generate temperature distribution of the developing solution D on the wafer top surface, and making it possible to perform the developing processing with higher uniformity.

Specifically, the wafer W is held by the holding pins 4 in a state it is spaced from the wafer holding section 2, and thus the temperature influence from the wafer holding section 2 is hardly exerted on the wafer W. Further, the contact area between the holding pins 4 and the wafer W while the holding pins 4 hold the wafer W is smaller compared with the contact area between the wafer holding section 2 and the wafer W when the wafer holding section 2 holds the wafer W, and the thermal capacity of the holding pins 4 is smaller compared to that of the wafer holding section 2. Thus, even if the holding pins 4 hold the wafer W, it hardly happens that the degree of temperature reduction of the developing solution D differs between the portions of the wafer in contact with the holding pins 4 and the portions not in contact therewith and the temperature difference is hard to occur in the developing solution D.

As a result, the development is performed with the temperature of the developing solution D being almost uniform all over the wafer surface, and the occurrence of unevenness in the development caused by the temperature difference is prevented, thereby reducing variations of the dimension of the development line width, and increasing uniformity of the developing processing. When the developing processing was actually performed for the wafer W coated with the I rays resist and exposed to have a predetermined pattern form in the aforementioned developing apparatus, a difference in the development line width was hardly found between the area close to the center and the peripheral portion of the wafer W, and thus it has been shown that uniform developing processing can be performed.

Figure 7:
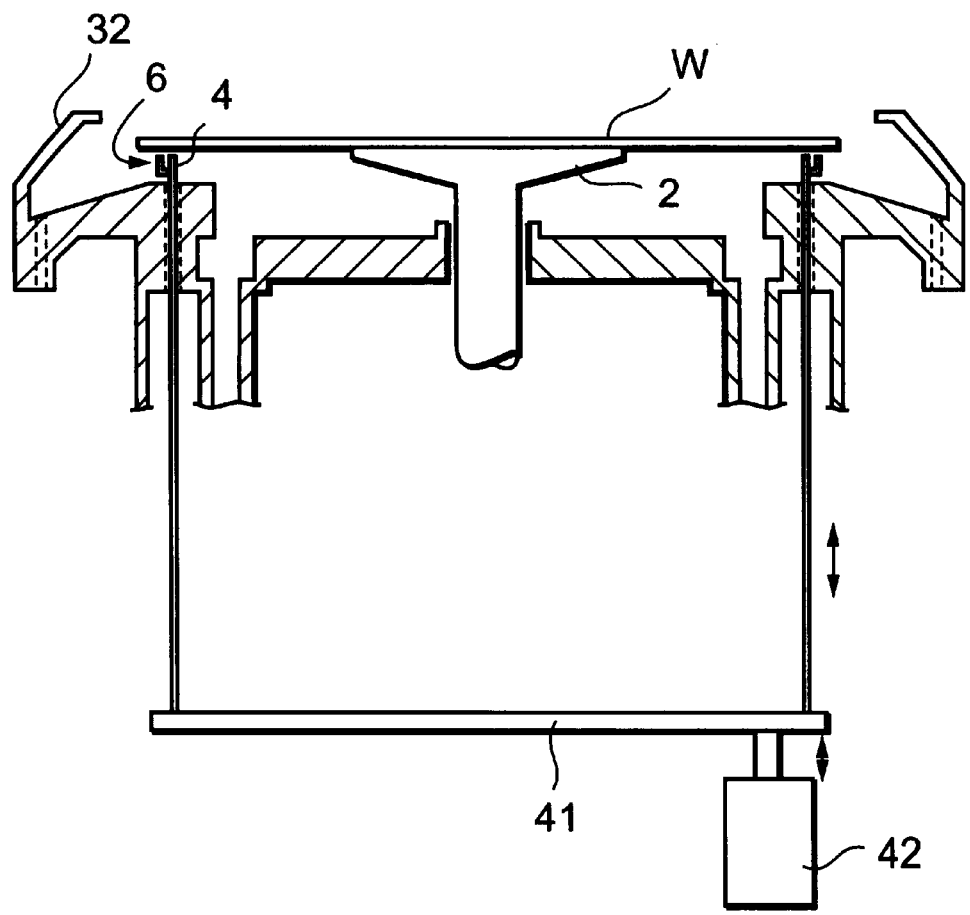
FIG. 7 is a sectional view showing another example of the developing apparatus of the present invention.

Subsequently, another example of the present invention will be explained based on FIGS. 7 to FIG. 9. This example differs from the aforementioned developing apparatus in the point that a ring member 6, which forms an annular member for preventing the developing solution and the like from coming onto the undersurface of the wafer W, is attached to the holding pins 4. In concrete, as shown in, for example, FIG. 7 and FIG. 8, the ring member 6 is provided to enclose an outer side of the holding pins 4 and consists of a ring body 61 with the holding pins 4 being attached at several positions of an inner edge thereof and a side wall portion 62 attached to the outer edge of the ring body 61. The ring member 6 is configured so that an upper end of the side wall portion 62 is in close proximity with the peripheral portion of the undersurface side of the wafer W to an extent in which they are almost in contact with each other (in the drawings, the upper end of the side wall portion 62 is illustrated to be away from the wafer W for convenience) when the holding pins 4 hold the wafer W, and when the developing solution D is heaped on the wafer W, the developing solution D is prevented from coming onto the undersurface at the area between the upper end of the side wall portion 62 and the undersurface of the wafer W.

In this embodiment, for example, the holding pins 4 are configured so that when they are in the waiting position located below the wafer W in the aforementioned processing position, an undersurface of the ring member 6 is located above the upper end of the inner cup 32 at the undersurface side of the wafer W, and that the holding pins 4 are vertically movable between the waiting position and the position which is above the waiting position, and in which they hold the wafer W to raise it above the wafer holding section 2.

Figure 9:
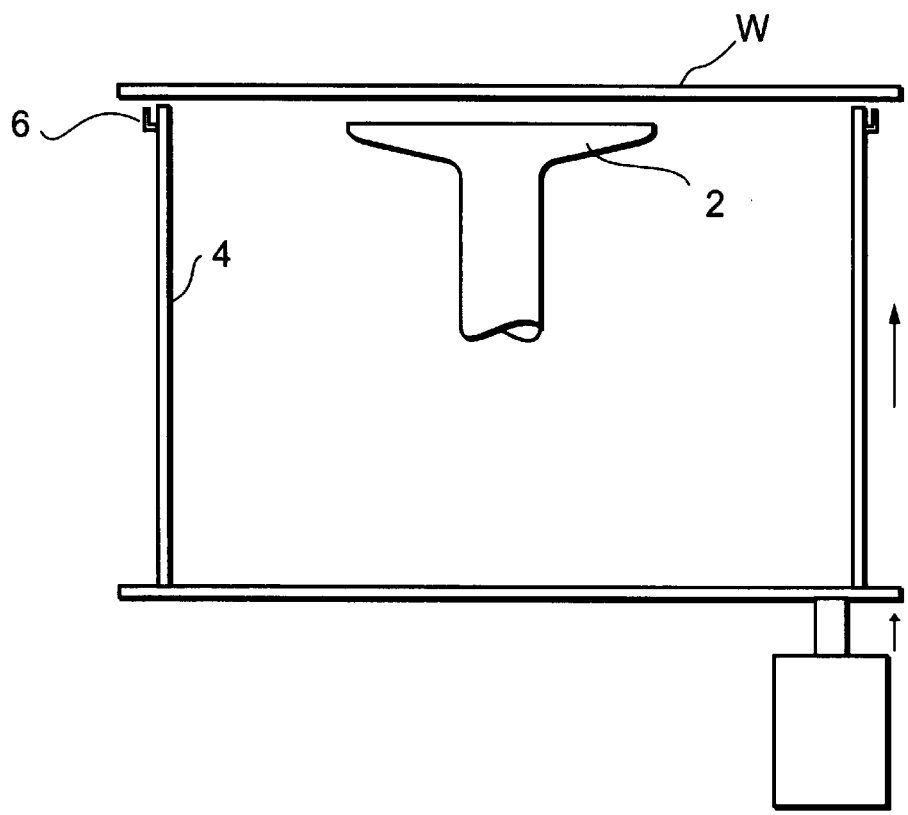
FIG. 9 is a side view showing the operation of the aforementioned developing apparatus.

In the above developing apparatus, as shown in FIG. 9, the holding pins 4 are raised, then the wafer W is transferred onto the holding pins 4 from the wafer holding section 2, and the development is performed with the wafer W being raised above the wafer holding section 2. As a result, as in the aforementioned example, the occurrence of the temperature distribution of the developing solution in the wafer top surface is prevented, thus making it possible to perform developing processing with higher uniformity. Since the developing solution D is prevented from coming onto the wafer undersurface at the area between the upper end of the side wall portion 62 of the ring member 6 and the wafer W as described above, the developing solution D is prevented from adhering to the wafer holding section 2 and the holding pins 4, thus making it possible to prevent the developing solution D from entering the driving system therefor.

Figure 10:
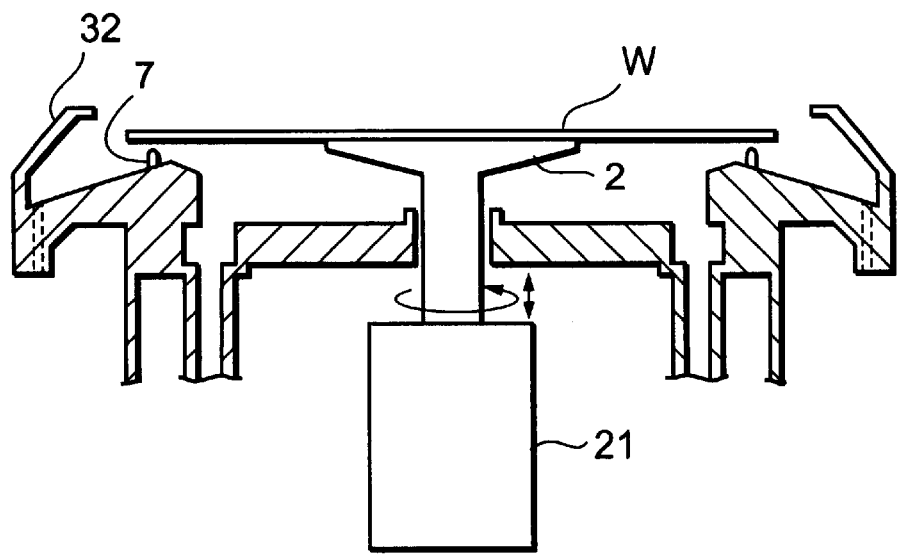
FIG. 10 is a sectional view showing still another example of the developing apparatus of the present invention.
Figure 11:
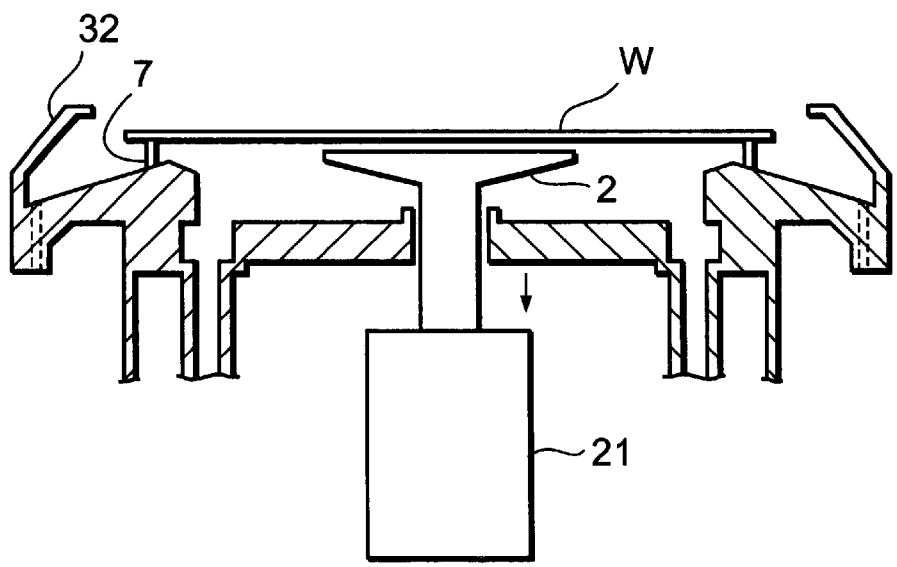
FIG. 11 is a side view showing the operation of the aforementioned developing apparatus.

Subsequently, still another example of the developing apparatus of the present invention will be explained based on FIG. 10 and FIG. 11. This example differs from the aforementioned developing apparatus in the point that the inner cup 32 is provided with a plurality of, for example, three protrusions 7, and the protrusions 7 are vertically moved relatively to the wafer W to hold the wafer W thereon.

These protrusions 7 form a substrate holding protrusion section, and they are attached at the inner cup 32 at the undersurface side of the wafer W so that upper ends of the protrusions 7 are located below the peripheral area (an area outside the area being held when the wafer W is held by the wafer holding section 2) of the undersurface side of the wafer W when, for example, the wafer W is in the aforementioned processing position. In this example, as shown in FIG. 11, the wafer holding section 2 is lowered to thereby lower the wafer W relatively to the protrusions 7, whereby transferring the wafer W onto the protrusions 7 from the wafer holding section 2.

In the above example, the wafer W is held by the protrusions 7, and the development is also performed with the wafer W being raised above the wafer holding section 2, thus preventing the occurrence of the temperature distribution of the developing solution D in the wafer top surface and making it possible to perform developing processing with higher uniformity as in the above examples. Further, in this example, the aforementioned ring member 6 may be also attached to the protrusions 7 to prevent the developing solution D from coming onto the wafer undersurface.

Figure 12A:
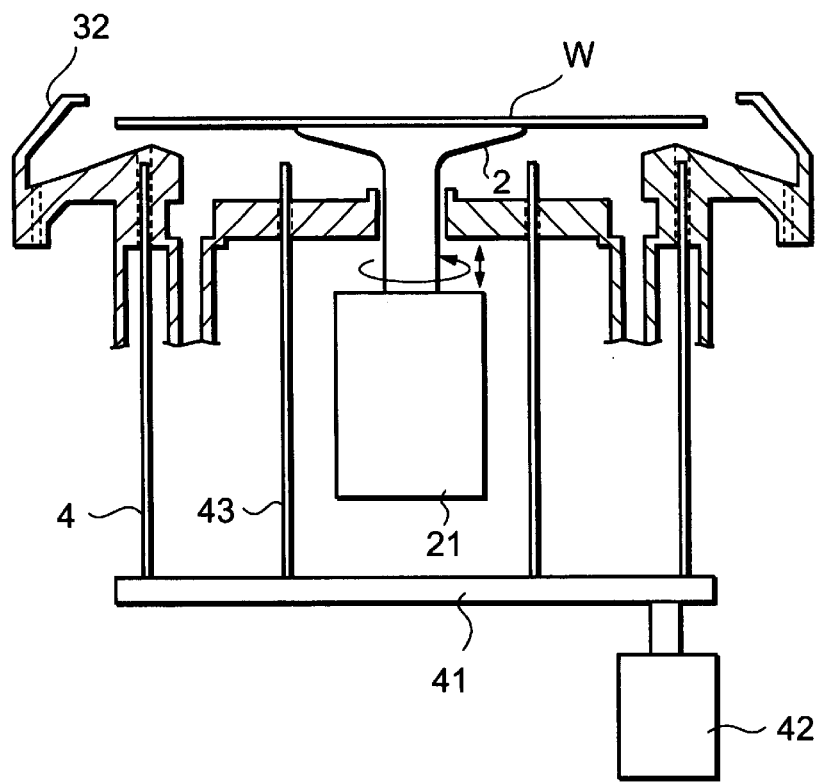
FIGS. 12A and 12B are sectional views showing still another example of the developing apparatus of the present invention.
Figure 12B:
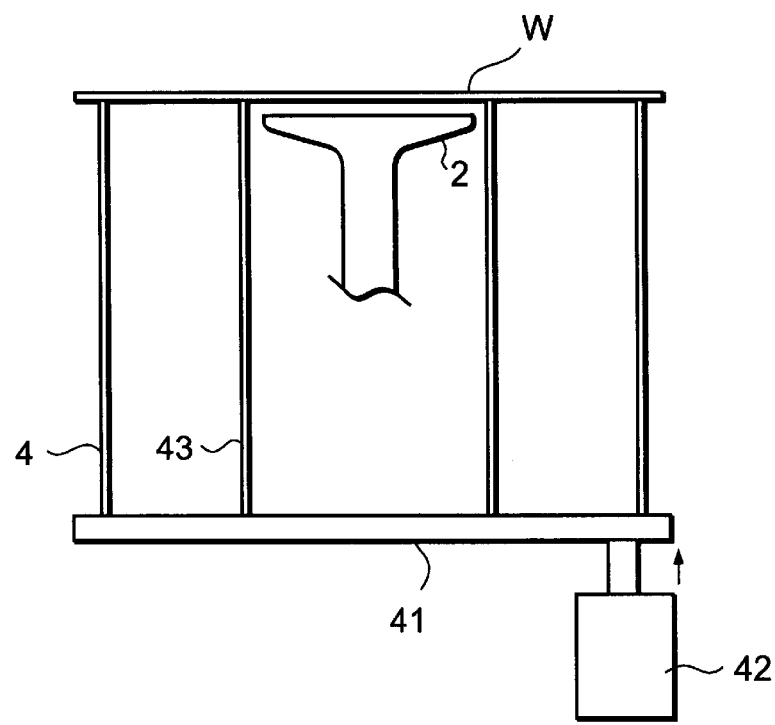

Further, in the present invention, for example, as shown in FIG. 12, the holding pins 4 for holding the wafer W at the peripheral area on its undersurface side may be provided to hold the wafer W at the area close to the outside of the wafer holding section 2. FIG. 12 shows an example having the configuration provided with holding pins 43 for holding the wafer W at the area close to the outside of the wafer holding section 2 and the holding pins 4 for holding the wafer W at the area close to the outer edge of the wafer W. In this case, the holding pins 4 and 43 are also vertically moved via the supporting arm 41 by means of the elevating mechanism 42 as in the above example.

In the above example, the wafer W is held at the area close to the outside of the wafer holding section 2 and the area close to the outer edge, and the development is performed with the wafer W being raised above the wafer holding section 2, thus preventing the temperature distribution of the developing solution D from occurring to the wafer top surface, and making it possible to perform developing processing with higher uniformity. Further, in this example, the wafer W is held at the areas close to the outside of the wafer holding section 2 and the outer edge, thus making it possible to prevent a warp or the like from occurring to the center portion and the outer edge portion when the wafer W is raised with the holding pins 4 and 43. As a result, the height of the developing solution is difficult to be nonuniform within the plane of the wafer W, and from this point of view, a higher uniformity of the developing processing can also be secured, thus making it effective in performing development especially for the wafer W of the size of 12 inches or more.

The aforementioned protrusions 7 may be provided to hold the area close to the outside of the wafer holding section 2, and the aforementioned ring member 6 may be attached to the holding pins 43 and the protrusions 7 for holding the area close to the outside of the wafer holding section 2 to thereby prevent the developing solution D from coming onto the undersurface of the wafer.

Figure 15A:
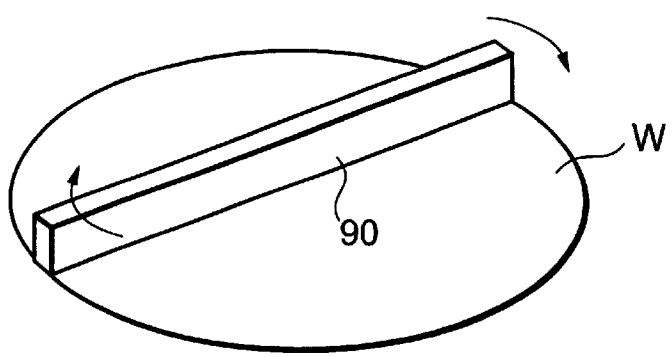
FIGS. 15A and 15B are according to still another example of the developing apparatus of the present invention.
Figure 15B:
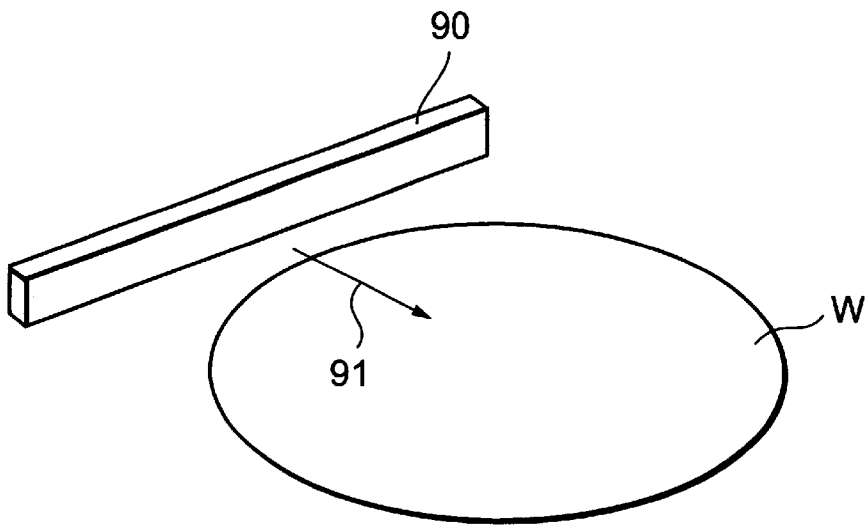

In the above embodiment, the developing solution is heaped while the wafer W is rotated 180 degrees, but instead of this, a nozzle 90 may be moved to scan, as shown in FIG. 15A in which the nozzle 90 is rotated 90 degrees or 180 degrees, or as shown in FIG. 15B in which the nozzle 90 is moved in the direction of the arrow 91 relatively to the wafer W remaining at rest.

Figure 16:
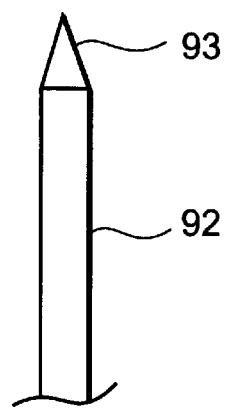
FIG. 16 is a side view showing a modification of a holding pin.

Further, since it is preferable that the contact area between a holding pin 92 and the wafer W is reduced to a minimum, it is suitable to form a tip end 93 in a pointed shape as shown in FIG. 16. In this case, it is suitable to use a heat insulation material as a material for the tip end portion, and a suitable material such as alumina is used.

Figure 17A:
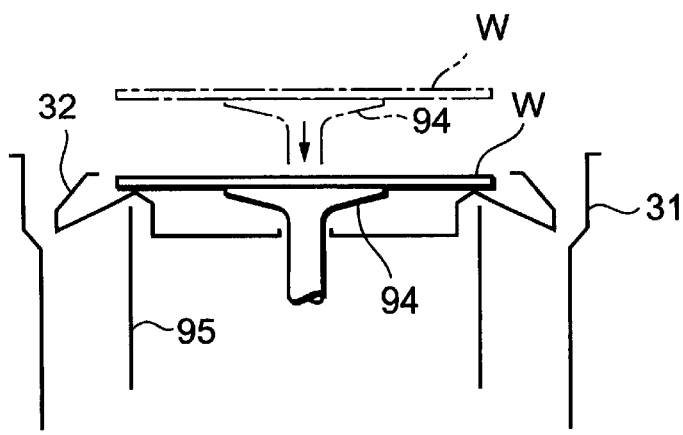
FIGS. 17A, 17B, and 17C are process views showing an operation according to still another example of the developing apparatus of the present invention.
Figure 17B:
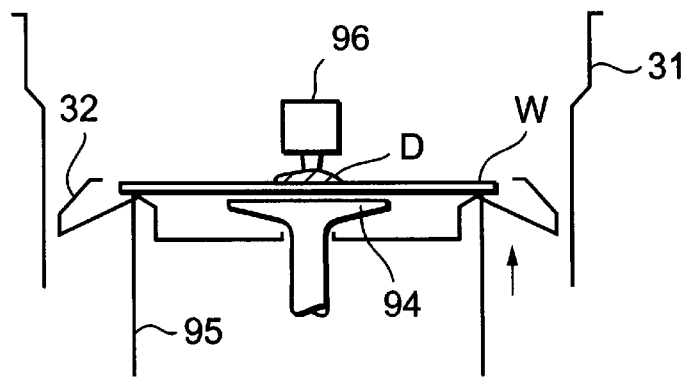
Figure 17C:
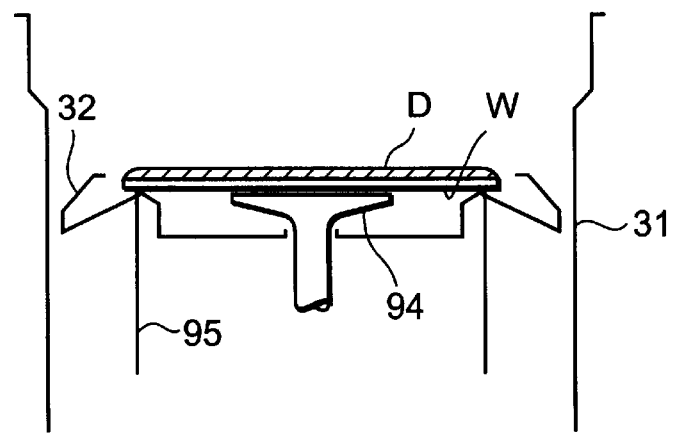

Next, a modified example shown in FIGS. 17A, 17B and 17C will be explained. In the above embodiment, the developing solution D is heaped while the wafer W is held by the wafer holding section 2 as in FIG. 4B, but instead of this, as shown in FIGS. 17A and 17B, the wafer W is held to be raised above a wafer holding section 94 by being transferred to holding pins 95 protruded to a higher position than the wafer holding section 94 which is displaced to a lower position. In this state, a nozzle 96 is rotated to perform the supply and heaping of the developing solution D. In FIG. 17C, that is, as in FIG. 5A, the wafer W may be left as it is for about 60 seconds to perform so-called rest development.

Figure 18A:
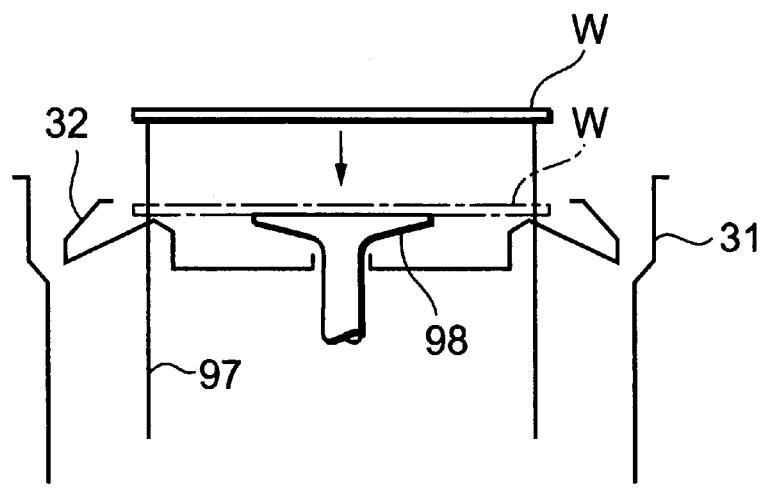
FIGS. 18A and 18B are process views showing the operation according to still another example of the developing apparatus of the present invention.
Figure 18B:
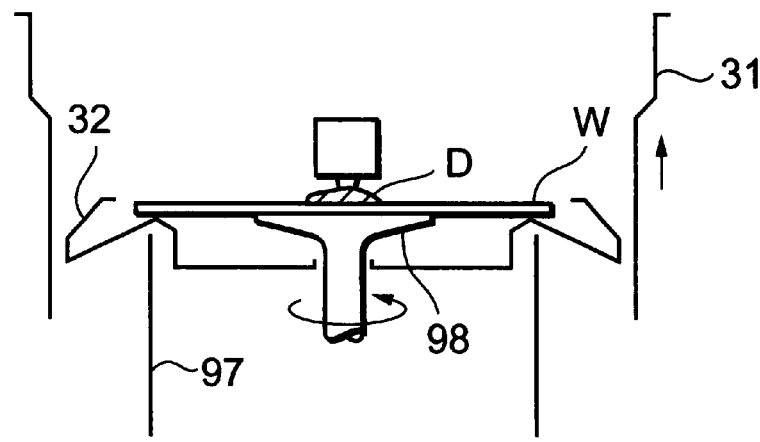

Next, a modified example shown in FIGS. 18A and 18B will be explained. In the above embodiment, as shown in FIG. 4A, the wafer holding section 2 receives the wafer W from the transfer device not illustrated at the delivery position for the wafer W and is displaced downward while holding the wafer W to the lower processing position, whereby performing supply and heaping of the development solution (FIG. 4B). Instead of this, as shown in FIG. 18A, the wafer W may be received by holding pins 97 displaced upward to the delivery position for the wafer W. The wafer W is transferred to a wafer holding section 98 to be supported thereon from the holding pins 97 displaced downward as shown in FIG. 18B. As in the case of FIG. 4B, the coating of the developing solution D is performed by the rotation of the wafer holding section 98. As a result, the drive mechanism for vertically moving the wafer W can be reduced in size.

Figure 19A:
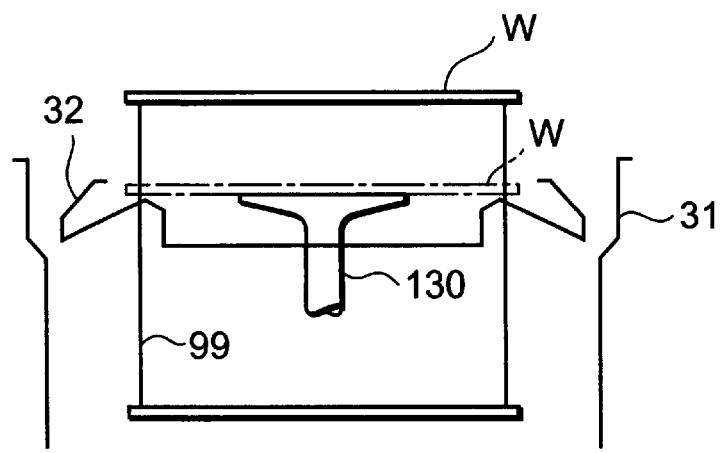
FIGS. 19A, 19B, and 19C are process views showing the operation according to still another example of the present invention.
Figure 19B:
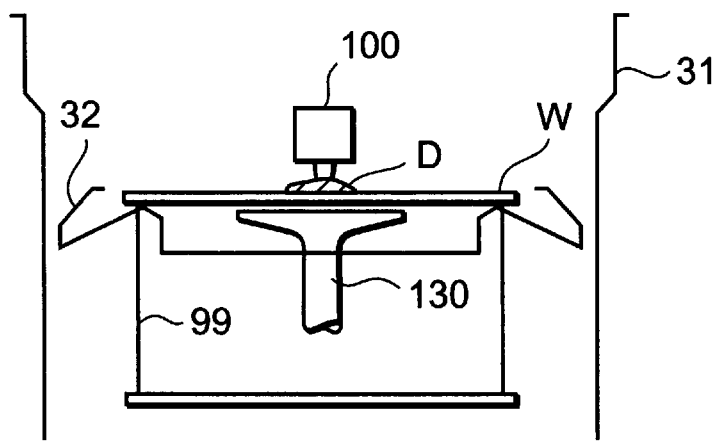
Figure 19C:
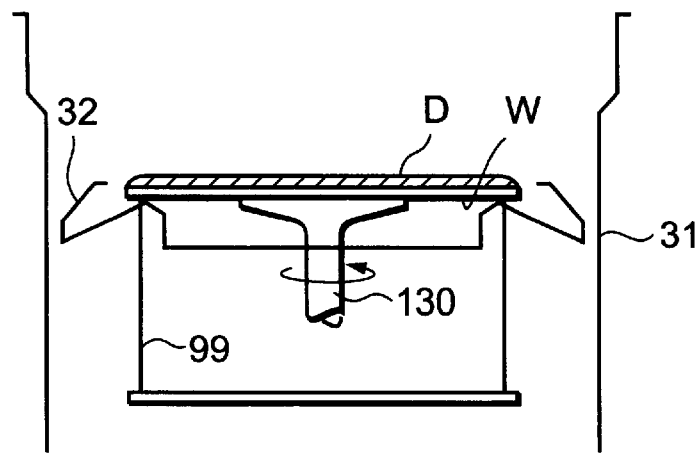

In the modified example in FIG. 18, the coating of the developing solution is performed while the wafer holding section 98 is rotated with the wafer W supported on the wafer holding section 98 as shown in FIG. 18B, but instead of this, as shown in FIGS. 19A, 19B and 19C, the wafer W received via the holding pins 99 at the wafer delivery position is lowered to the position shown by the alternate long and short dash line (FIG. 19A). At this time, heaping of the developing solution D is performed while, for example, a nozzle 100 is rotated 180 degrees with the wafer W being supported by the holding pins 99 as in FIG. 19B. As shown in FIG. 19C, rest development for 60 seconds may be performed with the wafer W being supported by the holding pins 99. In this case, the nozzle 100 is rotated, but the solution-heaping may be performed while the holding pins 99 side is rotated.

When the developing solution is shaken off, the holding pins 99 are further lowered to transfer the wafer W onto a wafer holding section 130, whereby rotating the wafer holding section 130 to shake off the developing solution. It goes without saying that in the modified examples in FIGS. 17A, 17B, 17C, 18A, 18B, 19 A, 19B and 19C, the developing solution may be heaped according to the method as shown in FIGS. 15A and 15B. Further, the ring member 6 is provided integrally with the holding pins 4 in FIG. 7, however, the ring member 6 and the holding pins 4 may be provided separately and they may be respectively provided with elevating mechanisms. In this case, when solution-heaping is performed with the wafer W being held by the wafer holding section 2 and when the wafer W with the solution being heaped thereon is held by the holding pins 4, the possibility of the solution coming onto the wafer undersurface can be reduced.

Figure 8:
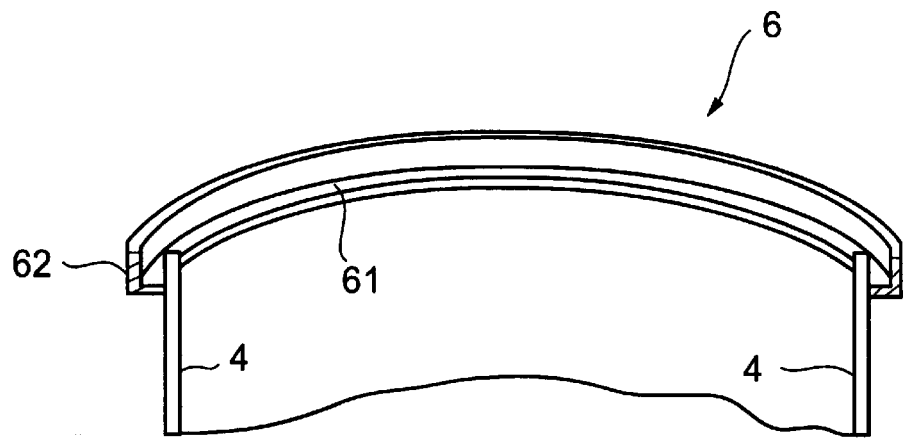
FIG. 8 is a perspective view showing a holding pin used in the aforementioned developing apparatus.
Figure 20:
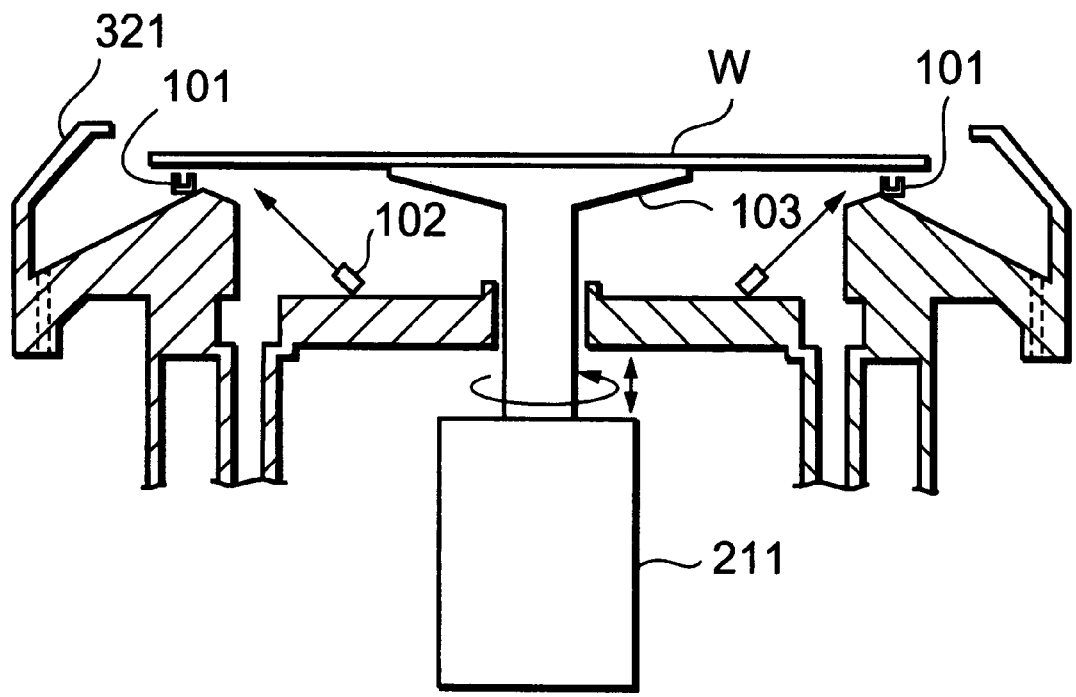
FIG. 20 is a process view showing the operation according to still another example of the present invention.

Further, in FIG. 8, the holding pins 4 are provided with the ring member 6 to thereby prevent the developing solution from coming onto the undersurface of the wafer W, but alternatively, as shown in FIG. 20, a water nozzle 102 for spouting hot water in a direction of a ring member 101 may be provided. Incidentally, numeral 103 denotes a wafer holding section, numeral 211 denotes a driving section, and numeral 321 denotes an inner cup. By additionally using the water nozzle 102, the undersurface of the wafer W can be cleaned, and the developing solution D can be effectively prevented from coming onto the underside.

Figure 21A:
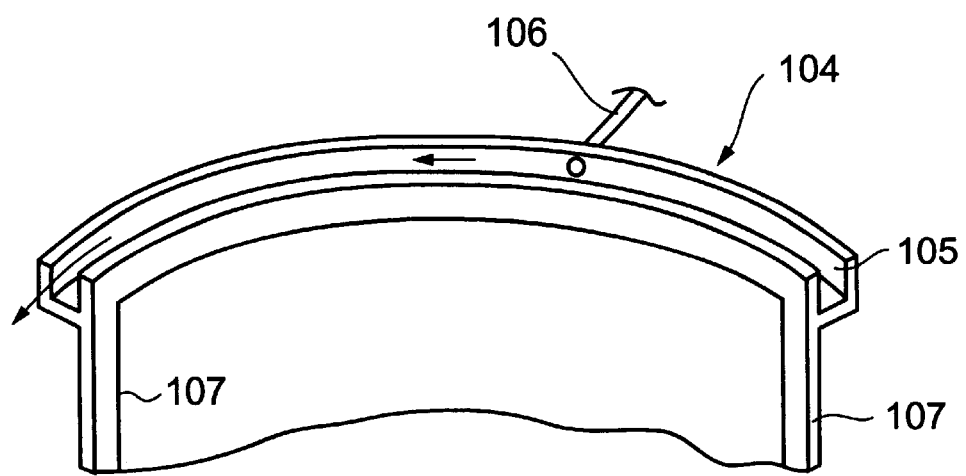
FIGS. 21A and 21B are partially perspective view and a side view showing holding pins according to still another example of the present invention.
Figure 21B:
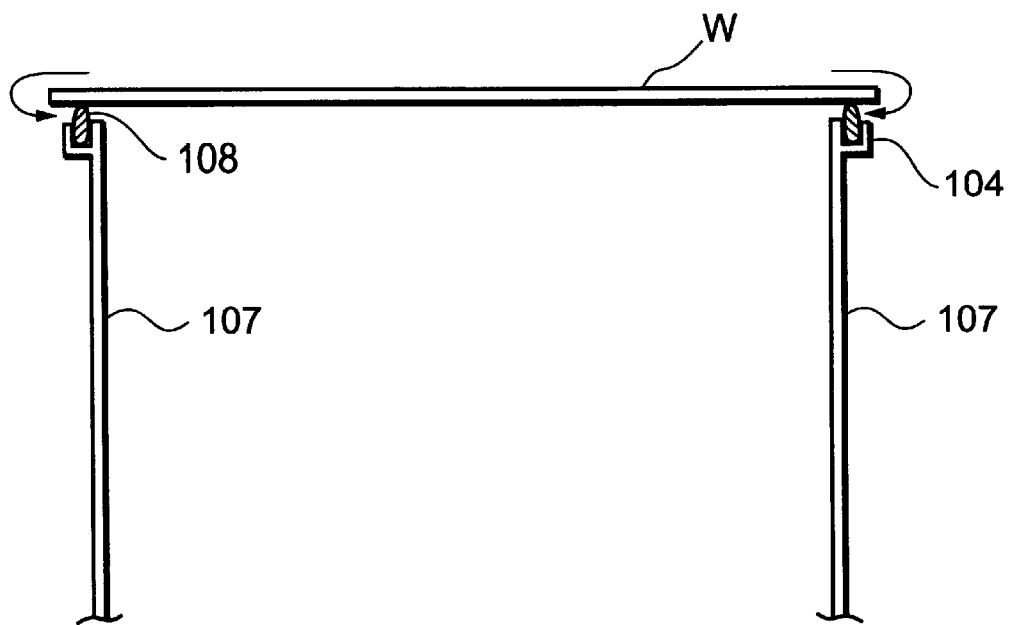

Furthermore, as shown in FIG. 21A, hot water may be introduced into a channel 105 of a ring member 104 provided at holding pins 107 from a conduit 106 to flow as shown by the arrows. By positively flowing water, a water seal is formed between the undersurface of the wafer W and the ring member 104. As a result, the wafer W is supported while being sealed with a water 108 in the channel 105 shown in FIG. 21B, which becomes more effective means for preventing the developing solution from coming onto the underside.

Figure 22A:
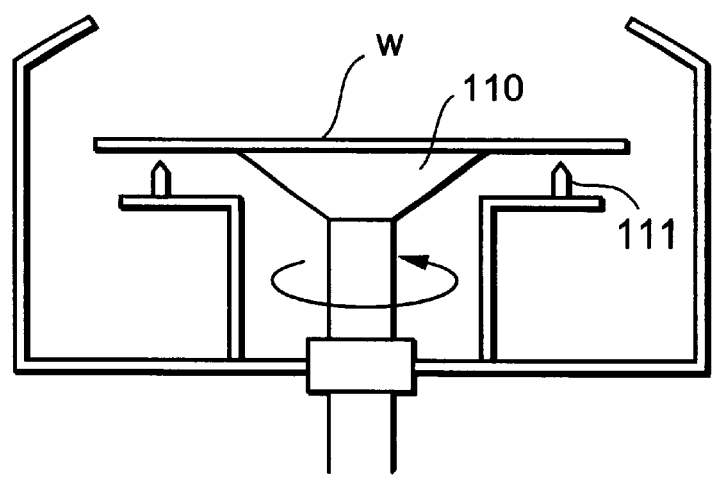
FIGS. 22A and 22B are sectional views showing an example in which the present invention is applied to a resist coating apparatus.
Figure 22B:
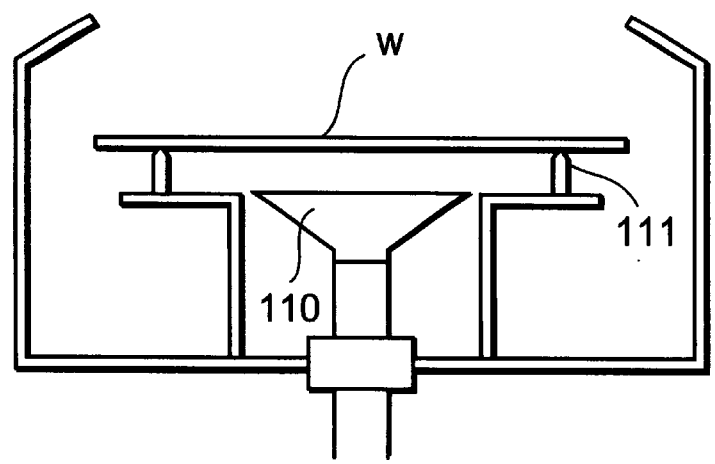

In the above embodiment and each modified example, the cases in which the present invention is applied to the developing apparatus for performing developing processing are explained, but as shown in FIG. 22, the wafer W can be supported with holding pins 111 being provided at a resist coating processing apparatus. Specifically, the wafer W is sucked to be held by a spin chuck 110 having a vacuum-suction function, and the spin chuck 110 is rotated. A resist solution dropped from above is spread over the entire surface of the wafer W by the rotation of the spin chuck 110 to thereby perform the coating (FIG. 22A). After completing the coating, the holding pins 111 are moved upward to thereby support the wafer W until the transfer device comes to take the wafer W, and the spin chuck 110 is moved downward (FIG. 22B). According to the above configuration, even if the waiting time until the transfer arm comes becomes long, the wafer W is supported by the holding pins 111, thus making it possible to prevent the resist film applied thereon from being under the thermal adverse influence caused by temperature gradient.

Figure 23:
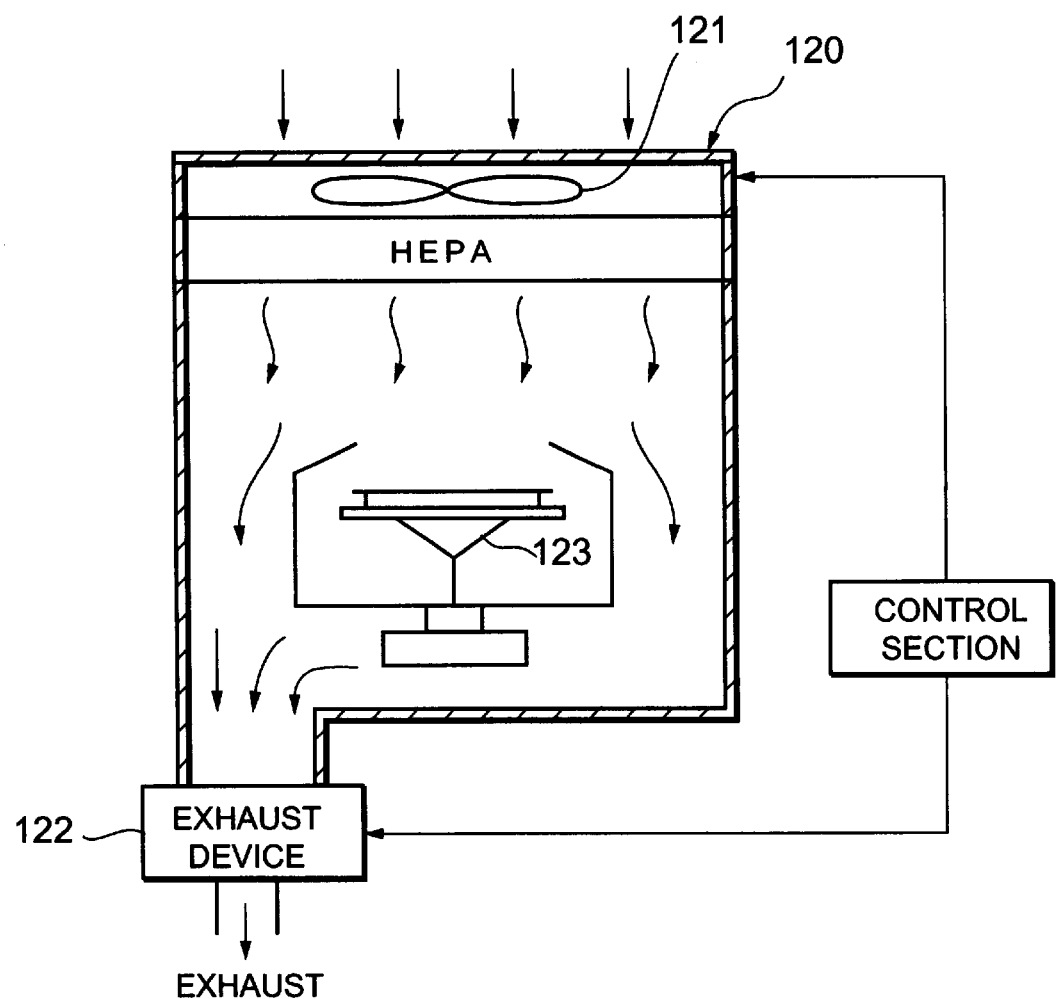
FIG. 23 is an exhaust system diagram explaining an operation of an exhaust apparatus used in the developing apparatus of the present invention.
Figure 24:
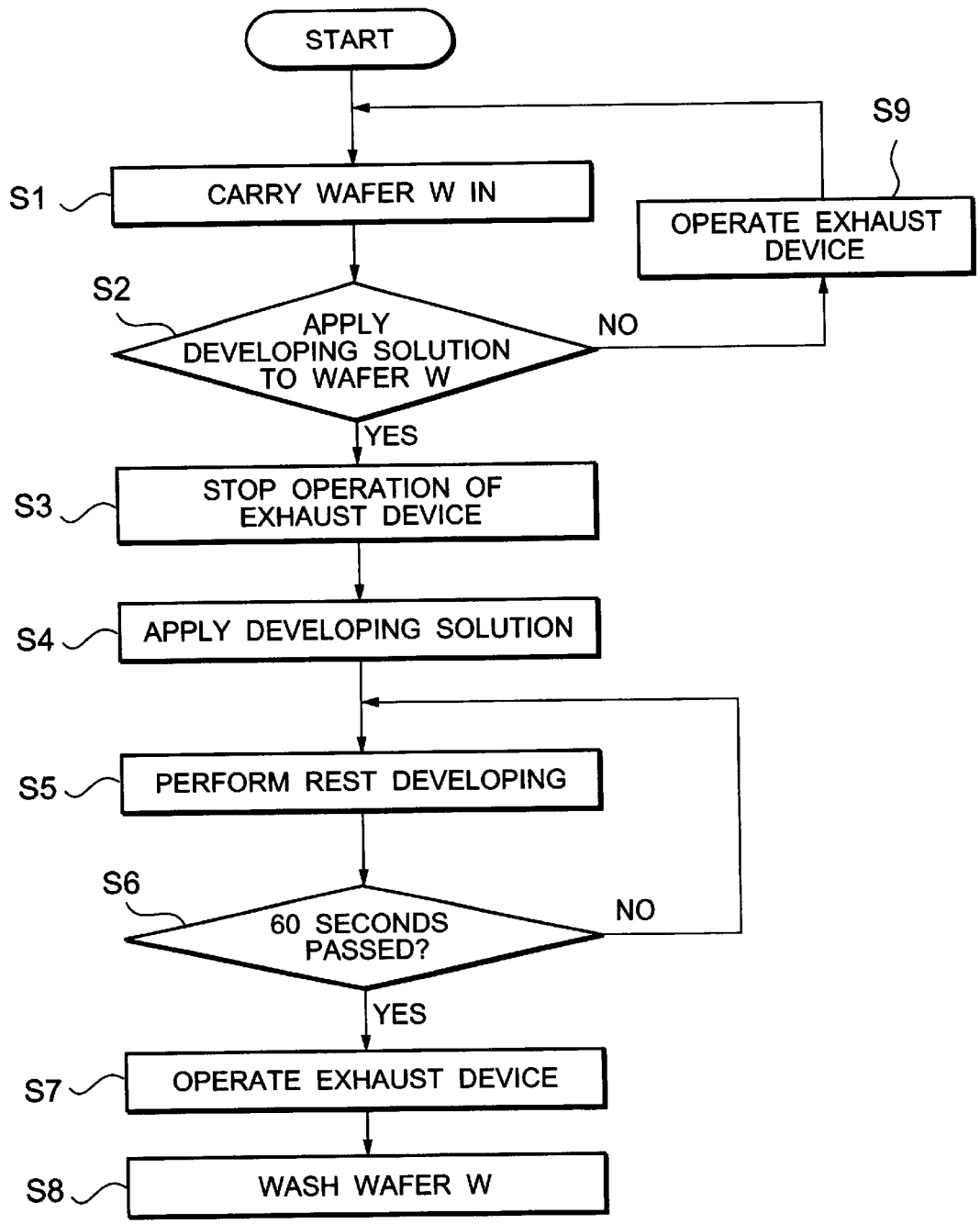
FIG. 24 a flowchart showing a control of the aforementioned exhaust system.
Figure 25A:
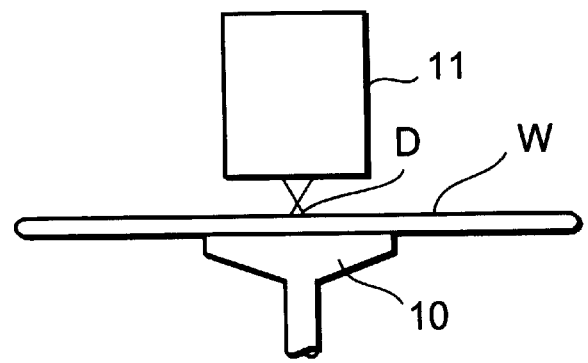
FIGS. 25A, 25B and 25C are process views showing a conventional developing method.
Figure 25B:
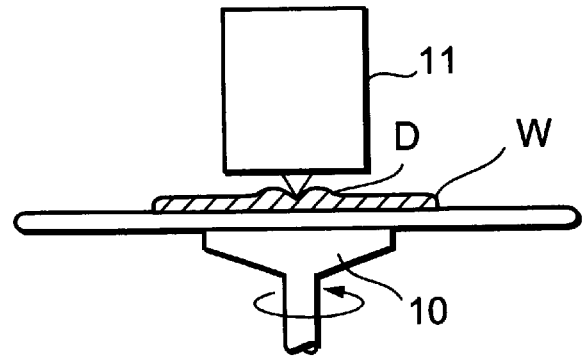
Figure 25C:
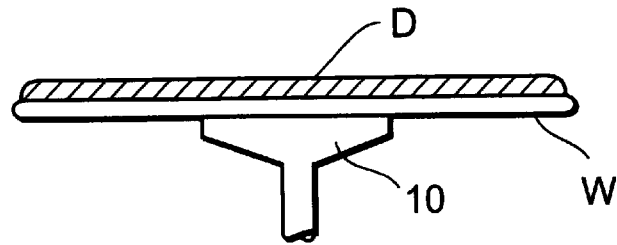
Figure 26:
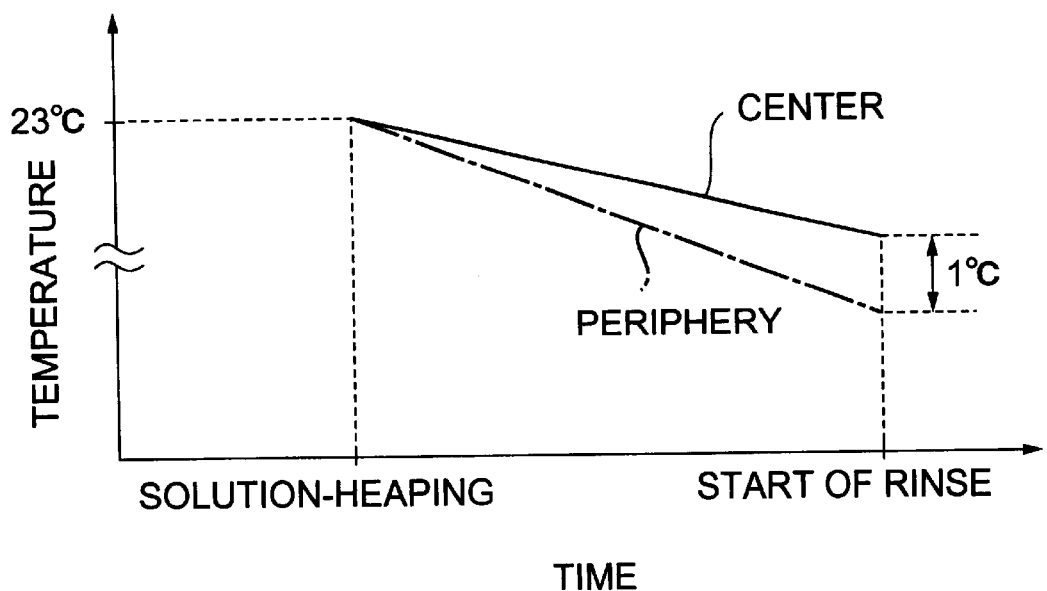
FIG. 26 is a property diagram showing the conventional temperature variation of the developing solution.

Further, in a developing unit 120 in FIG. 23, it is normally preferable that air supplied into the unit 120 is exhausted outside by an air blower fan 121 via a down flow exhaust device 122. Especially, when the top surface of the wafer is dry, it is preferable to exhaust air in terms of preventing mist from redepositing thereon. However, during development, it is not preferable to exhaust air when the developing solution is on the wafer W, because temperature variation occurs to the wafer W due to the volatilization of the solution. Thus, it is suitable to provide a control section 124 to control the operation of the exhaust device 122. Specifically, as in the flowchart shown in FIG. 24, in step 1, the wafer W is carried into the developing unit 120 ( in FIG. 24, step is represented by "S"). In step 2, it is determined whether or not the developing solution is applied. If it is applied, the operation of the exhaust device 122 is stopped in step 3, and the coating of the developing solution is applied to the wafer W (step 4). In step 5, rest development is performed, and it is determined whether or not 60 seconds has lapsed in step 6. If it is determined as YES, the exhaust device 122 is operated again in step 7, and the down flow air is supplied into the developing unit 120, whereby starting a washing process of the wafer W (step 8). If it is determined that the coating of the developing solution is not applied to the wafer W in step 2, the exhaust device 122 is in a state of operation (S9), and the transfer of the wafer W is performed.

According to the above configuration, when the developing solution is on the wafer W, air exhaust is stopped to thereby prevent the temperature variation of the wafer W caused by the vaporization of the developing solution, thus making it possible to realize excellent developing processing.

Figure 13:
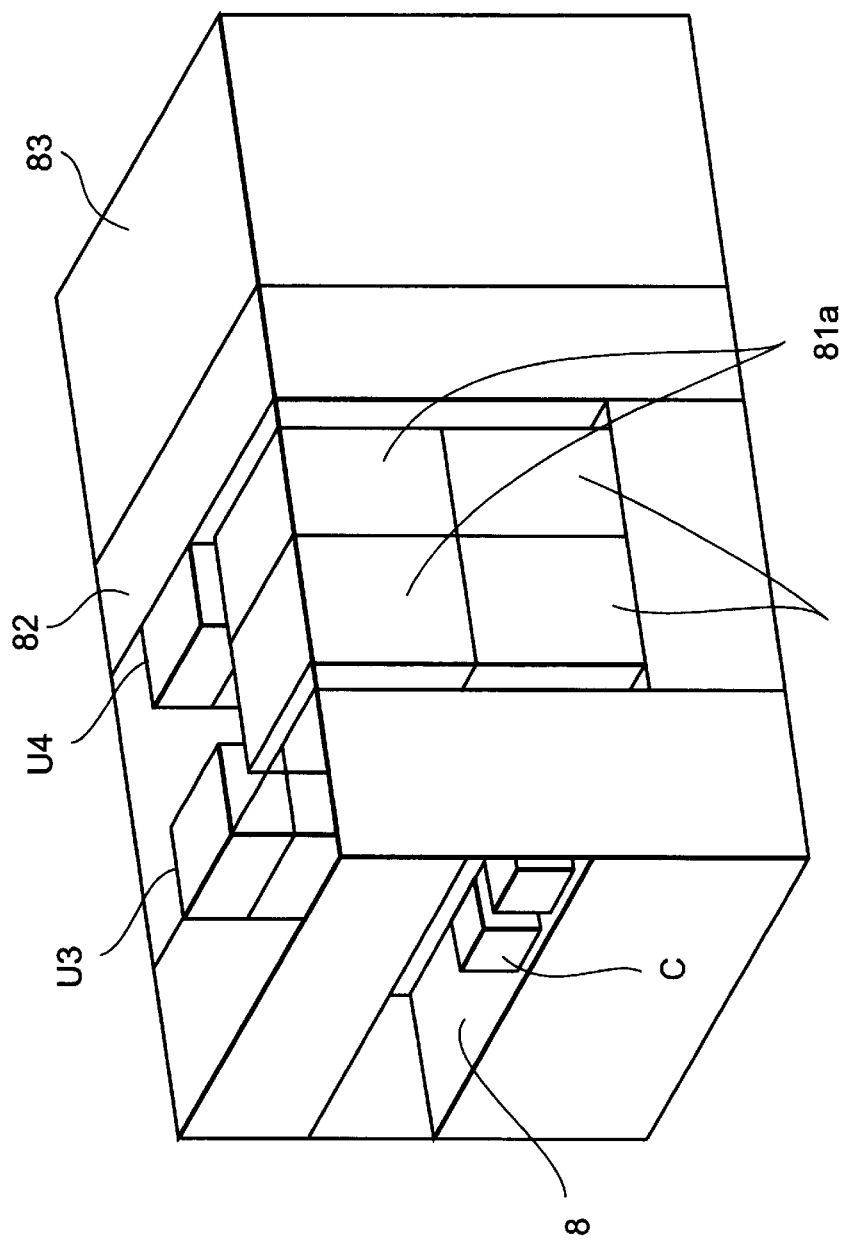
FIG. 13 is a perspective view showing an example of a coating and developing apparatus in which the aforementioned developing apparatus is incorporated.
Figure 14:
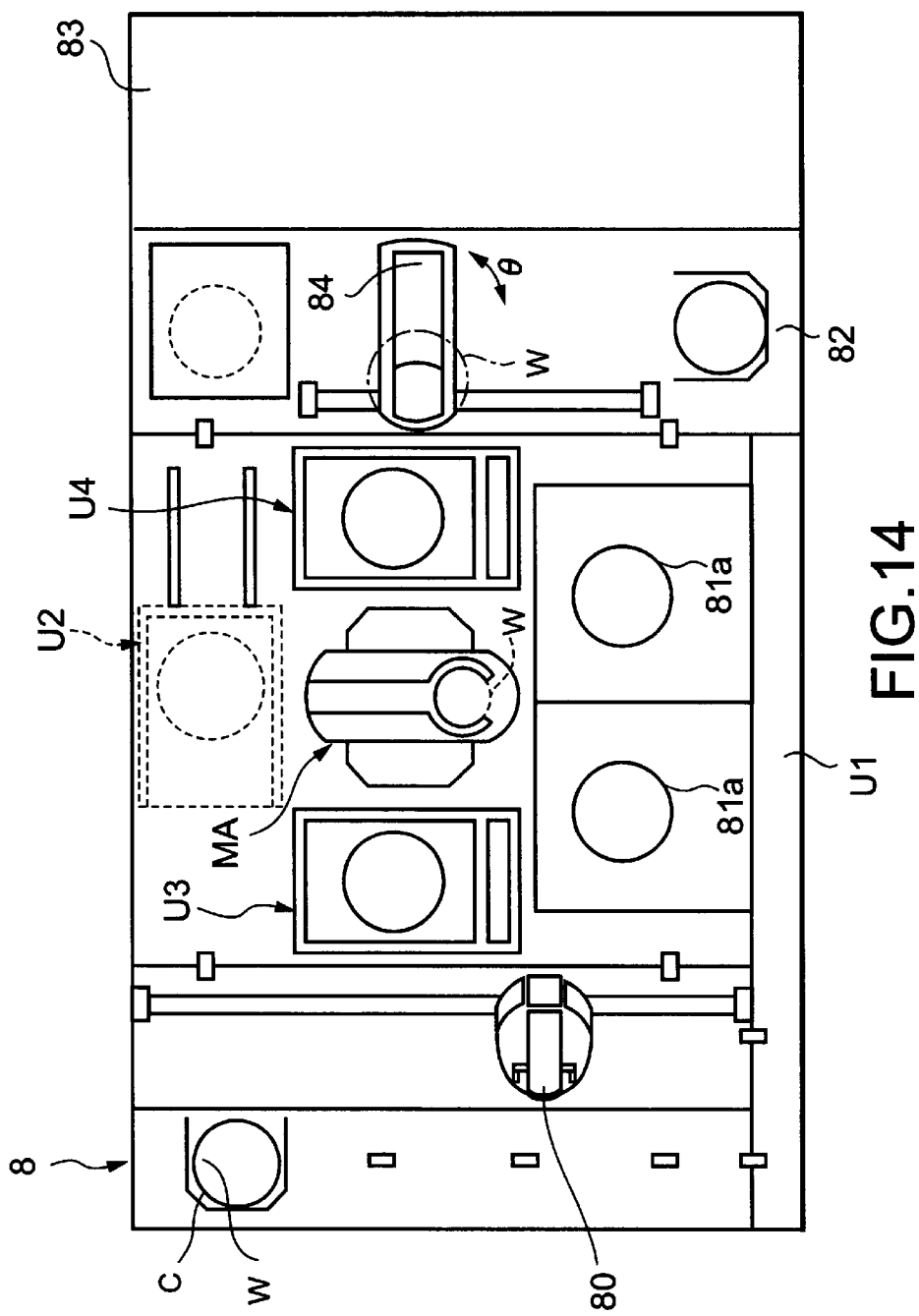
FIG. 14 is a plan view showing an example of the coating and developing apparatus in which the aforementioned developing apparatus is incorporated.

Subsequently, the outline of an example of a coating and developing apparatus incorporating the developing apparatus used in carrying out a developing method according to the present invention in the unit will be explained with reference to FIG. 13 and FIG. 14. In FIG. 13 and FIG. 14, numeral 8 denotes a carrying-in-and-out stage for carrying in and out a wafer cassette, on which a cassette C housing, for example, 25 wafers is placed by, for example, an automatic transfer robot. In the area facing the carrying-in-and-out stage 8, a delivery arm 80 for the wafer W is provided to be movable in an X and Y direction and rotatable in θ direction(rotation around a circular vertical axis). Further, at the back of this transfer arm 80, for example, seeing the back from the carrying-in-and-out stage 8, a unit U1 for coating and developing system is at the right side, units U2, U3 and U4 for heating and cooling system are respectively disposed at the left, front, and back side, and a wafer transfer arm MA constructed to be, for example, movable vertically, laterally and longitudinally, and rotatable around a vertical axis is provided for transferring the wafer W between the units for the coating and developing system, and the units for the heating and cooling system. In FIG. 13, the unit U2 and the wafer transfer arm MA are not shown for convenience.

In the units for coating and developing system, for example, two developing units 81a are provided on an upper tier and two coating units 81b are provided on a lower tier. In the units for the heating and cooling system, the heating unit, cooling unit, hydrophobic processing unit and the like are provided on an upper and lower tier. If the aforementioned part including the aforesaid coating and developing system units and the heating and cooling system units is called a clean track, an aligner 83 is connected to the back side of the clean track via an interface unit 82. The interface unit 82 transfers the wafer W between the clean track and the aligner 83 by means of a wafer transferring arm 84 constructed to be, for example, vertically, laterally and longitudinally movable, and rotatable around the vertical axis.

Explaining the flow of the wafer W in this apparatus, initially the wafer cassette C housing the wafers W is carried in the aforementioned carrying-in-and-out stage 8 from the outside, the wafer W is taken out of the cassette C by the wafer transferring arm 80, and transferred to the wafer transferring arm MA via the delivery table being one of the shelves of the aforementioned heating and cooling unit U3. Subsequently, after the hydrophobic processing is performed in a processing section on one shelf inside the unit U3, the coating of the resist solution is performed in the coating unit 81b to thereby form the resist film. After the wafer W coated with the resist film is heated in the heating unit, it is sent to the aligner 83 via the interface unit 82, where it is exposed via the mask corresponding to a pattern.

Then, after the wafer W is heated in the heating unit, it is cooled in the cooling unit, and subsequently, it is sent to the developing unit 81a, where the developing processing is performed, thus forming a resist mask. Thereafter, the wafer W is returned into the cassette C on the carry-in-and-out stage 8.

In the present invention described above, the substrate is not limited to a wafer, but a glass substrate for liquid crystal display may be used. As for the substrate holding protrusion section for holding the wafer, the number, the shape, the mounting position and the like are not limited to the above configuration, if only they are constructed to be vertically movable relatively to the wafer holding section 2, and if only they hold the wafer W with the wafer W being spaced from the wafer holding section 2 during development.

According to the present invention, the degree of temperature variation of the developing solution within the plane of the substrate is made uniform, and uniformity in the temperature of the developing solution within the substrate plane is increased, thus preventing the occurrence of unevenness in development caused by the temperature difference in the developing solution, and making it possible to perform processing with higher uniformity.

The aforementioned embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A developing apparatus for developing a first surface of a substrate having the first and a second surface, comprising:
   a substrate holding section for holding the second surface of the substrate;
   substrate holding protrusion section provided to be vertically movable relatively to said substrate holding section so that it does not interfere with said substrate holding section, for holding the substrate with the substrate being spaced from said substrate holding section; and
   a supply section for supplying a developing solution onto the first surface of the substrate,
   wherein development is performed for the first surface of the substrate in the state in which the substrate with the developing solution being heaped thereon is spaced from said substrate holding section by said substrate holding protrusion section, with the developing solution remaining heaped.

2. The apparatus as set forth in claim 1,
   wherein said substrate holding section holds an area close to a center of the second surface of the substrate, and said substrate holding protrusion section holds a peripheral area of the second surface of the substrate, which is outside the area held by said substrate holding section.

3. The apparatus as set forth in claim 1,
   wherein said substrate holding protrusion section holds an area close to the outside of the area held by said substrate holding section, which is a peripheral area outside the area held by said substrate holding section, and an area close to an outer edge of the substrate, of the second surface of the substrate.

4. The apparatus as set forth in claim 1,
   wherein a contact area between said substrate holding protrusion section and the substrate is smaller than a contact area between said substrate holding section and the substrate.

5. The apparatus as set forth in claim 4,
   wherein tip ends of said substrate holding protrusion section are in a pointed form and made of a heat insulating material.

6. The apparatus as set forth in claim 1,
   wherein said substrate holding protrusion section includes an annular member for preventing the developing solution from coming onto the second surface of the substrate.

7. The apparatus as set forth in claim 6, further comprising:
   means for forming a water seal between said annular member and the second surface of the substrate.

8. The apparatus as set forth in claim 1, further comprising:
   means for supplying a predetermined solution onto the second surface of the substrate held by said substrate holding section.

9. The apparatus as set forth in claim 1, further comprising:
   means for supplying down flow air from above the substrate held by said substrate holding section or said substrate holing protrusion section; and
   exhaust means for exhausting the air from under the substrate,
   wherein air exhaust by said exhausting means is stopped at least during rest development of the substrate.

10. A solution supplying apparatus, comprising:
    a substrate holding section for holding a second surface of a substrate having a first and the second surface;
    a substrate holding protrusion section disposed around said substrate holding section, for holding the second surface of the substrate;
    an elevating mechanism for vertically and relatively moving said substrate holding section and said substrate holding protrusion section; and
    a supply section for supplying a predetermined solution onto the first surface of the substrate.

11. The apparatus as set forth in claim 10,
    wherein said substrate holding protrusion section transfers the substrate in the state that said substrate holding protrusion section is raised above said substrate holding section.

12. The apparatus as set forth in claim 10,
    wherein said supply section supplies the predetermined solution onto the first surface of the substrate held by said substrate holding protrusion section.

13. The apparatus as set forth in claim 12,
    wherein said supply section has a supply nozzle having a longer supply width than at least a radius of the substrate, and a mechanism for rotating said nozzle on the substrate held by said substrate holding protrusion section.

14. The apparatus as set forth in claim 10,
    wherein said substrate holding section is rotatable while holding the substrate.

15. The apparatus as set forth in claim 10,
    said supply section supplies the predetermined solution onto the first surface of the substrate held and rotated by said substrate holding section.

16. A developing method for supplying a developing solution onto a substrate to perform development, comprising the steps of:
    allowing a substrate holding section to hold the substrate to perform heaping of the developing solution on a processed surface of the substrate;
    subsequently, vertically moving a substrate holding protrusion section relatively to the substrate holding section so that the substrate holding protrusion section does not interfere with said substrate holding section, transferring the substrate to the substrate holding protrusion section from said substrate holding section, and performing development of the processed surface of the substrate, with the substrate being spaced from said substrate holding section by means of the substrate holding protrusion section, with the developing solution remaining heaped thereon.

* * * * *